US010566332B2

(12) United States Patent
Wang et al.

(10) Patent No.: US 10,566,332 B2
(45) Date of Patent: Feb. 18, 2020

(54) SEMICONDUCTOR DEVICES

(71) Applicant: Micron Technology, Inc., Boise, ID (US)

(72) Inventors: Kuo-Chen Wang, Tokyo (JP); Shih-Fan Kuan, Taoyuan (TW); Lars Heineck, Hiroshima (JP); Sanh D. Tang, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/192,097

(22) Filed: Nov. 15, 2018

(65) Prior Publication Data

US 2019/0088658 A1 Mar. 21, 2019

Related U.S. Application Data

(60) Continuation of application No. 15/840,972, filed on Dec. 13, 2017, now Pat. No. 10,163,909, which is a
(Continued)

(51) Int. Cl.
*H01L 27/108* (2006.01)
*H01L 21/027* (2006.01)
(Continued)

(52) U.S. Cl.
CPC .... *H01L 27/10823* (2013.01); *H01L 21/0273* (2013.01); *H01L 21/31053* (2013.01);
(Continued)

(58) Field of Classification Search
CPC ................................................ H01L 27/11568
See application file for complete search history.

(56) References Cited

U.S. PATENT DOCUMENTS

2011/0198758 A1* 8/2011 Jeon .................. H01L 21/28525
257/774
2012/0132971 A1* 5/2012 Mikasa ............. H01L 27/10814
257/296
(Continued)

FOREIGN PATENT DOCUMENTS

KR 10-2012-0059399 A 6/2012
KR 10-2014-0086647 A 7/2014
(Continued)

OTHER PUBLICATIONS

Taiwanese Office Action, dated Jun. 19, 2017, and Search Report, dated Jun. 15, 2017, for Taiwanese Application No. 105118495, 16 pages.
(Continued)

*Primary Examiner* — Raj R Gupta
(74) *Attorney, Agent, or Firm* — TraskBritt

(57) ABSTRACT

A semiconductor memory device includes a semiconductor substrate having active areas and a trench isolation region between the active areas. The active areas extend along a first direction. Buried word lines extend along a second direction in the semiconductor substrate. Two of the buried word lines intersect with each of the active areas, separating each of the active areas into a digit line contact area and two cell contact areas. The second direction is not perpendicular to the first direction. A digit line contact is disposed on the digit line contact area. A storage node contact is disposed on each of the two cell contact areas. The digit line contact and the storage node contact are coplanar. At least one digit line extends along a third direction over a main surface of the semiconductor substrate. The at least one digit line is in direct contact with the digit line contact.

20 Claims, 34 Drawing Sheets

Related U.S. Application Data division of application No. 15/151,503, filed on May 11, 2016, now Pat. No. 9,881,924.

(51) Int. Cl.

| | |
|---|---|
| *H01L 21/3105* | (2006.01) |
| *H01L 21/311* | (2006.01) |
| *H01L 21/762* | (2006.01) |
| *H01L 23/522* | (2006.01) |
| *H01L 23/528* | (2006.01) |
| *H01L 23/532* | (2006.01) |
| *H01L 29/06* | (2006.01) |

(52) U.S. Cl.
CPC .. *H01L 21/31144* (2013.01); *H01L 21/76224* (2013.01); *H01L 23/528* (2013.01); *H01L 23/5226* (2013.01); *H01L 23/53257* (2013.01); *H01L 23/53271* (2013.01); *H01L 27/10811* (2013.01); *H01L 27/10855* (2013.01); *H01L 27/10885* (2013.01); *H01L 27/10888* (2013.01); *H01L 27/10891* (2013.01); *H01L 29/0649* (2013.01)

(56) References Cited

U.S. PATENT DOCUMENTS

| | | |
|---|---|---|
| 2012/0264298 A1 | 10/2012 | Kim |
| 2013/0001682 A1* | 1/2013 | Tang ................... H01L 21/84 257/331 |
| 2013/0015551 A1* | 1/2013 | Wang ............... H01L 27/10882 257/499 |
| 2014/0264517 A1 | 9/2014 | Kim et al. |
| 2017/0330882 A1 | 11/2017 | Wang et al. |

FOREIGN PATENT DOCUMENTS

| | | |
|---|---|---|
| TW | 423152 B | 2/2001 |
| TW | 201106445 A | 2/2011 |

OTHER PUBLICATIONS

Korean Office Action for Korean Application No. 10-2016-0073432, dated Jul. 5, 2017, 21 pages.
Korean Final Office Action from Korean Application No. 10-2016-0073432, dated Jan. 24, 2018, 9 pages with English translation.
Chinese Office Action and Search Report from Chinese Application No. 201610668659.3, dated Jul. 4, 2018, 9 pages.

\* cited by examiner

SEMICONDUCTOR DEVICES

CROSS-REFERENCE TO RELATED APPLICATION

This application is a continuation of U.S. patent application Ser. No. 15/840,972, filed Dec. 13, 2017, now U.S. Pat. No. 10,163,909, issued Dec. 25, 2018, which is a divisional of U.S. patent application Ser. No. 15/151,503, filed May 11, 2016, now U.S. Pat. No. 9,881,924, issued Jan. 30, 2018, the disclosure of each of which is hereby incorporated herein in its entirety by this reference.

TECHNICAL FIELD

The present invention relates to a semiconductor device and fabrication method thereof, and more particularly, to a semiconductor memory device having coplanar, low-resistance digit line contacts and storage node contacts in its memory array and a method for fabricating the same.

BACKGROUND

As known in the art, a DRAM device includes numerous memory cells, and each memory cell stores one bit of information. A memory cell typically consists of a capacitor and an access transistor. One source or drain region of the access transistor is connected to one of the capacitor terminals. The other source or drain region and the transistor gate electrode are connected to a bit line (or a digit line) and a word line, respectively. In addition, the other capacitor terminal is connected to a reference voltage. Therefore, it is important to provide a proper electrical connection between components of the devices for operation. Such connections between device components can be made by contacts formed in the insulating layer.

With recent advances of semiconductor manufacturing techniques, design rules are getting smaller and smaller for semiconductor devices. As a result, alignment margin is difficult to secure, especially when aligning contacts between closely spaced conductive lines. As semiconductor devices become highly integrated, a contact margin between a digit line contact plug and a digit line contact area have been decreased, generating limitations such as misalignment or overlay issues, for example, cell contact to digit line contact overlay, digit line to digit line contact overlay, and storage node to cell contact overlay.

Further, as the landing areas for forming the digit line contact and cell contact become smaller and smaller because of the shrinking active areas in the memory array, the contact resistance increases dramatically, especially when misalignment occurs.

BRIEF SUMMARY

It is one object of the invention to provide an improved DRAM device comprised of a plurality of memory cells having an effective cell size of 6F2 and coplanar, low-resistance digit line contacts and storage node contacts in the memory array of the DRAM device.

It is another object of the invention to provide an improved DRAM device having buried word lines and a capacitor-over-digit line structure.

It is still another object of the invention to provide a method for fabricating a DRAM device having coplanar, low-resistance digit line contacts and storage node contacts in the memory array with improved margin for contact landing.

In one aspect of the invention, a semiconductor memory device includes a semiconductor substrate having active areas and a trench isolation region between the active areas. The active areas extend along a first direction. Buried word lines extend along a second direction in the semiconductor substrate. Two of the buried word lines intersect with each of the active areas, thereby separating each of the active areas into three portions including a digit line contact area and two cell contact areas. The second direction is not perpendicular to the first direction. A digit line contact is disposed directly on the digit line contact area. A storage node contact is disposed directly on each of the two cell contact areas. The digit line contact and the storage node contact are coplanar. At least one digit line extends along a third direction over a main surface of the semiconductor substrate. The digit line is in direct contact with the digit line contact.

The digit line contact comprises a digit line contact plug and a first metal plug directly on the digit line contact plug. A surface area of the digit line contact plug is greater than that of the digit line contact area. A first annular spacer surrounds the first metal plug over the digit line contact plug.

The storage node contact comprises a cell contact plug and a second metal plug directly on the cell contact plug. A surface area of the cell contact plug is greater than that of each of the two cell contact areas. A second annular spacer surrounds the second metal plug over the cell contact plug.

According to another aspect of the invention, a method for fabricating a semiconductor memory device is disclosed. A semiconductor substrate is provided. Active areas and a trench isolation region isolating the active areas from one another are formed. The active areas extend along a first direction. The semiconductor substrate is covered with a plug material layer. The plug material layer is in direct contact with the active areas. Buried word lines are formed along a second direction. The buried word lines penetrate through the plug material layer and extend into the semiconductor substrate, thereby cutting the plug material layer into a plurality of line-shaped plug patterns between the buried word lines. Two of the buried word lines intersect with each of the active areas, separating each of the active areas into three portions including a digit line contact area and two cell contact areas. The second direction is not perpendicular to the first direction. Line-shaped photoresist patterns extending along the first direction are formed on the line-shaped plug patterns and on the active areas.

An etching process is then performed to etch the line-shaped plug patterns not covered by the line-shaped photoresist patterns, thereby cutting the line-shaped plug patterns into digit line contact plugs and cell contact plugs directly on the digit line contact area and the cell contact areas, respectively. Recessed trenches are formed in place between the digit line contact plugs and the cell contact plugs along the second direction. The digit line contact plugs and the cell contact plugs are coplanar.

After performing an etching process to etch the line-shaped plug patterns, the line-shaped photoresist patterns are removed. An insulating layer is deposited on the semiconductor substrate in a blanket manner. The insulating layer fills up the recessed trenches. The insulating layer outside the recessed trenches is polished away to expose top surfaces of the digit line contact plugs and the cell contact plugs.

After polishing away the insulating layer outside the recessed trenches, the top surfaces of the digit line contact plugs and the cell contact plugs are recessed or etched to a predetermined level that is lower than top surface of the insulating layer, thereby forming a recessed area directly above each of the digit line contact plugs and the cell contact plugs. First annular spacers are formed on the digit line contact plugs and second annular spacers are formed on the cell contact plugs, respectively.

After forming the annular spacer on each of the digit line contact plugs and the cell contact plugs, first metal plugs are formed on the digit line contact plugs and second metal plugs are formed on the cell contact plugs, respectively. At least one digit line extending along a third direction is formed to electrically connect the first metal plugs on the digit line contact plugs. The digit line comprises a metal layer, a mask layer on the metal layer, and sidewall spacers on opposite sidewalls of the digit line. The metal layer is structurally integral with the first metal plugs. Each of the first annular spacers surrounds each of the first metal plugs. Each of the second annular spacers surrounds each of the second metal plugs.

These and other objectives of the present invention will no doubt become obvious to those of ordinary skill in the art after reading the following detailed description of the preferred embodiments that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 1 to FIG. 30A are schematic diagrams illustrating a method for fabricating a memory device in accordance with one embodiment of the present invention, wherein:

FIG. 1 is a top view of the schematic layout of a memory array of the memory device after the formation of columns of buried word lines (BWLs) according to one embodiment of the invention;

FIG. 2 and FIG. 3 are schematic, cross-sectional views taken along line I-I' and II-II', respectively, in FIG. 1;

FIG. 2A, and FIG. 3A are schematic diagrams illustrating a process for fabricating three-dimensional (3D) contact plugs in accordance with another embodiment of this invention, wherein FIG. 2A and FIG. 3A are schematic, cross-sectional views taken along line I-I' and II-II', respectively, in FIG. 1;

FIG. 4 and FIG. 5 are schematic, cross-sectional views taken along line I-I' and II-II', respectively, in FIG. 1, after removing the cap layer during the manufacture of the memory device according to one embodiment of the invention;

FIG. 6 is a top view of the schematic layout of the memory array of the memory device after the formation of line-shaped photoresist patterns along the reference AA direction according to one embodiment of the invention;

FIG. 7 and FIG. 8 are schematic, cross-sectional views taken along line I-I' and II-II', respectively, in FIG. 6;

FIG. 9 is a top view of the schematic layout of the memory array of the memory device after etching the line-shaped first plug patterns not covered by the line-shaped photoresist patterns according to one embodiment of the invention;

FIG. 10 and FIG. 11 are schematic, cross-sectional views taken along line I-I' and II-II', respectively, in FIG. 9;

FIG. 12 and FIG. 13 are schematic, cross-sectional views taken along line I-I' and II-II', respectively, in FIG. 9, after removing the line-shaped photoresist patterns and after filling up the recessed trenches with an insulating layer;

FIG. 14 is a top view of the schematic layout of the memory array of the memory device after recessing the digit line contact plugs and the cell contact plugs and after forming an annular spacer according to one embodiment of the invention;

FIG. 15 and FIG. 16 are schematic, cross-sectional views taken along line I-I' and II-II', respectively, in FIG. 14;

FIG. 17 is a top view of the schematic layout of the memory array of the memory device after forming digit lines or bit lines (BLs) electrically connected to the digit line contact plugs along the reference x-axis according to one embodiment of the invention;

FIG. 18 and FIG. 19 are schematic, cross-sectional views taken along line I-I' and II-II', respectively, in FIG. 17;

FIG. 20 is a top view of the schematic layout of the memory array of the memory device after forming sidewall spacers and an inter-layer dielectric (ILD) layer according to one embodiment of the invention;

FIG. 21 and FIG. 22 are schematic, cross-sectional views taken along line I-I' and II-II', respectively, in FIG. 20;

FIG. 23 is a top view of the schematic layout of the memory array of the memory device after forming line-shaped photoresist patterns according to one embodiment of the invention;

FIG. 24 and FIG. 25 are schematic, cross-sectional views taken along line I-I' and II-II', respectively, in FIG. 23;

FIG. 26 is a top view of the schematic layout of the memory array of the memory device after forming storage nodes in the storage node trenches according to one embodiment of the invention;

FIG. 27 and FIG. 28 are schematic, cross-sectional views taken along line I-I' and II-II', respectively, in FIG. 26;

FIG. 29 and FIG. 30 are schematic, cross-sectional views taken along line I-I' and II-II', respectively, in FIG. 26, showing the memory device after forming capacitors on respective storage nodes; and FIG. 29A, and FIG. 30A are schematic diagrams illustrating a process for fabricating three-dimensional (3D) contact plugs in accordance with another embodiment of this invention, wherein FIG. 29A and FIG. 30A are schematic, cross-sectional views taken along line I-I' and II-II', respectively, in FIG. 26.

Figure 1:
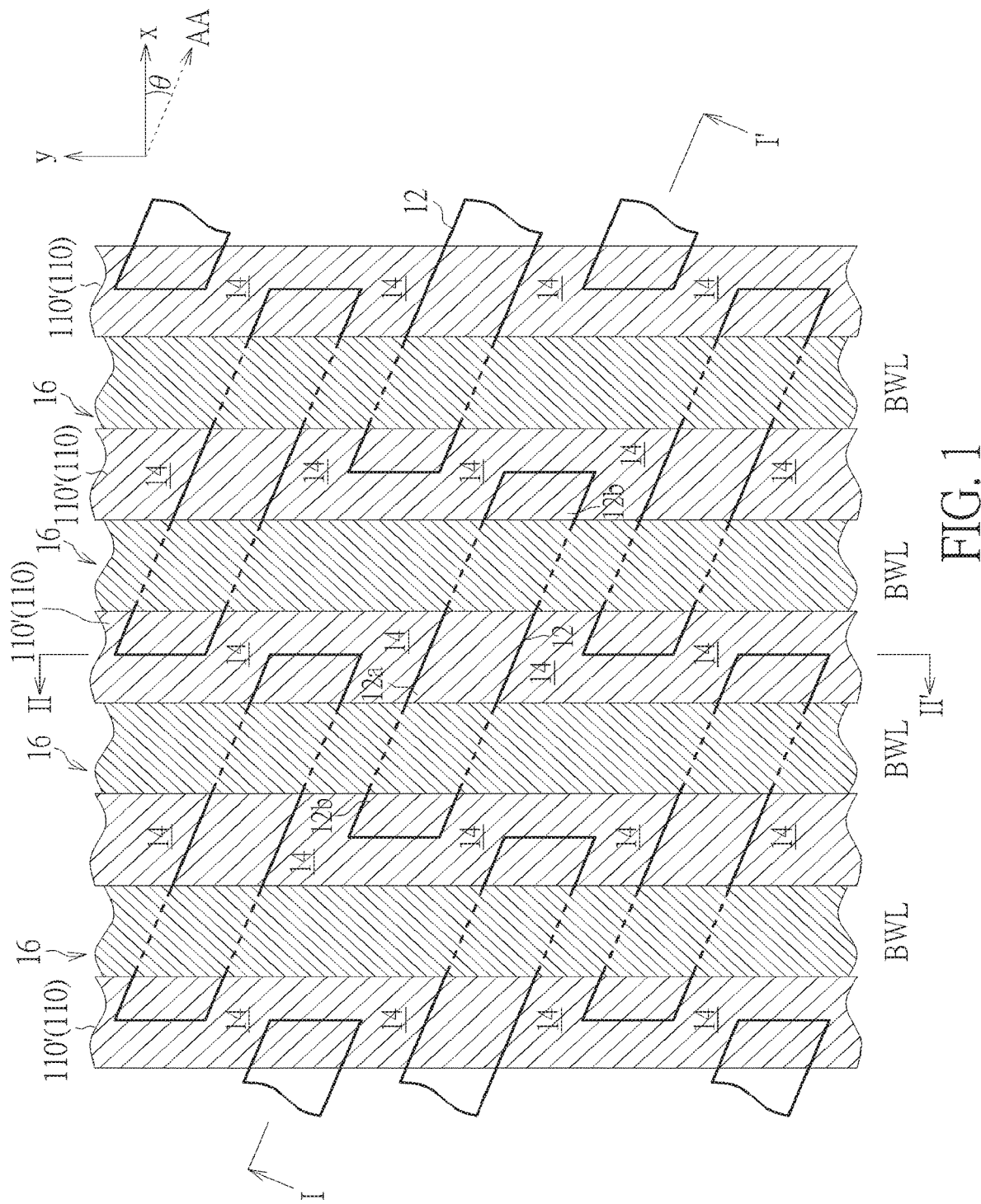

It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the accompanying drawings, wherein like reference numerals are used to refer to like elements throughout, and wherein the illustrated structures are not necessarily drawn to scale.

The terms "wafer" and "substrate" used herein include any structure having an exposed surface onto which a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the semiconductor substrate, regardless of its orientation. The term "vertical" refers to a direction perpendicular to the term "horizontal" as just defined. Terms, such as "on," "above," "below," "bottom," "top," "side" (as in "sidewall"), "higher," "lower," "over," and "under," are defined with respect to the horizontal plane.

The width of the feature is also referred to as the CD or minimum feature size ("F") of the line. The CD is typically the smallest geometrical feature, such as the width of an interconnect line, contact, or trench, that is formed during IC manufacturing using a given technology, such as photolithography.

The present invention pertains to an improved DRAM device that is comprised of a plurality of memory cells (3×2 cell) having an effective cell size of $6F^2$ (e.g., 3F×2F) and self-aligned, coplanar cell contact plugs and bit line (or digit line) contact plugs. The DRAM cell of the DRAM device according to the present invention has a buried word line (BWL) structure and a capacitor-over-bit line (COB) structure. The bit line (BL) (or digit line) is integrally formed with the metal plug directly on each of the digit line contact plugs.

FIGS. 1-30A are schematic diagrams illustrating a method for fabricating a memory device in accordance with one embodiment of the present invention.

Figure 2:
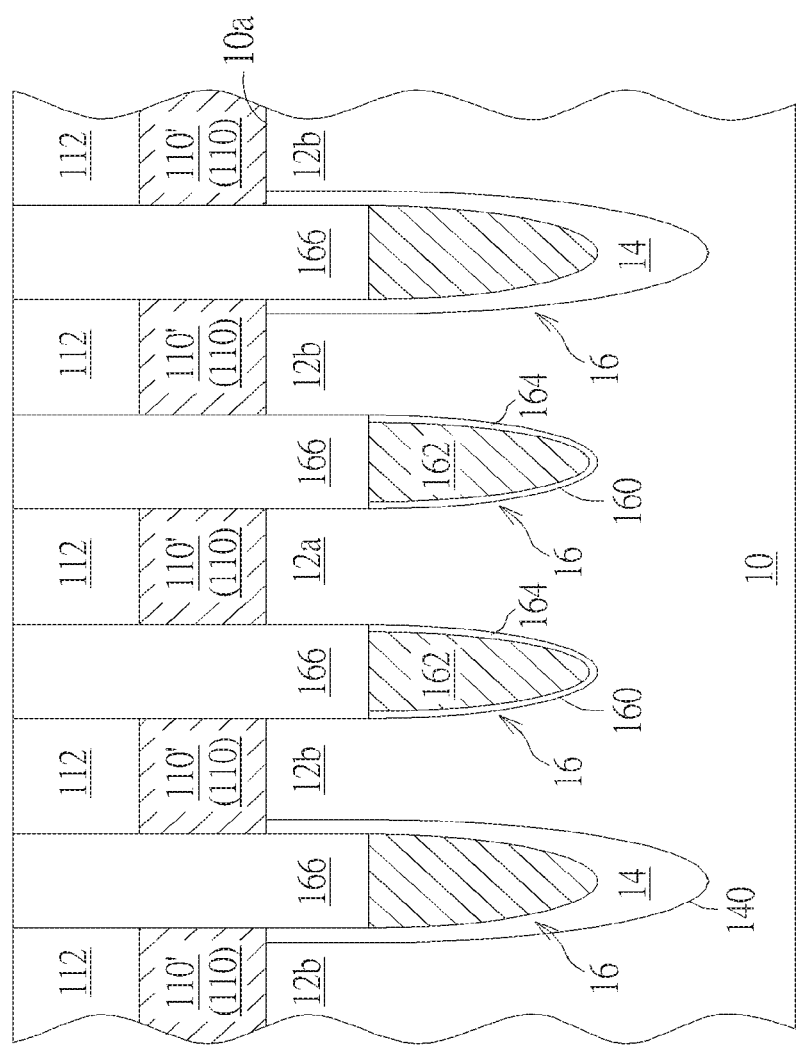
Figure 3:
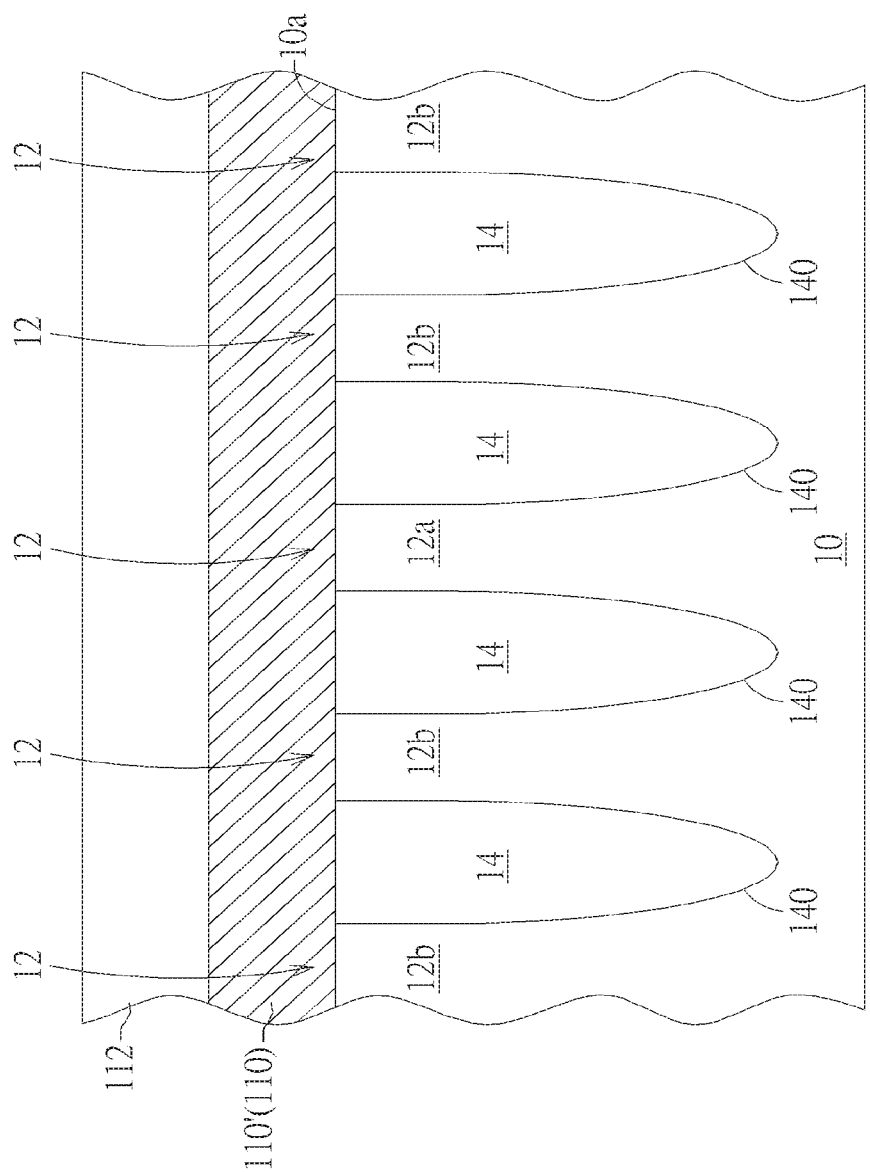

Please refer to FIGS. 1-3. FIG. 1 is a top view of the schematic layout of the memory array of the memory device after the formation of buried word lines (BWLs) according to one embodiment of the invention. FIG. 2 and FIG. 3 are schematic, cross-sectional views taken along lines I-I' and II-II', respectively, in FIG. 1.

First, a semiconductor substrate 10 such as a silicon substrate or a silicon wafer is provided. The semiconductor substrate 10 has a main surface (or top surface) 10a. A plurality of slender, island-shaped active areas (AAs) 12 is formed in the semiconductor substrate 10. Shallow trench isolation (STI) structures 14 are provided between the active areas 12 to isolate active areas 12 from one another.

The formation of the STI structures 14 is known in the art. For example, using conventional lithographic processes, a photoresist pattern (not shown) may be formed on the semiconductor substrate 10, which defines trench patterns to be etched into the semiconductor substrate 10. Using the photoresist pattern as a hard mask, a dry etching process is performed to etch the semiconductor substrate 10 to thereby form STI trenches 140. After removing the photoresist pattern, the STI trenches 140 are filled with insulating materials such as silicon oxide, thereby forming the STI structures 14. A polishing process such as a chemical-mechanical polishing (CMP) may be performed to remove the excess insulating materials outside the STI trenches 140.

According to one embodiment of the invention, the longitudinal direction (or lengthwise direction) of each active area 12 extends along a reference AA direction. According to the embodiment of the invention, each active area 12 has a longer side and a shorter side. The longer side is parallel with the longitudinal direction of each active area 12 or reference AA direction. An included angle (acute angle) θ between the reference AA direction and a reference x-axis direction may range between 15° and 60°, but is not limited thereto.

After the formation of the STI structures 14, a plug material layer 110 and a cap layer 112 are formed on the top surface 10a of the semiconductor substrate 10 in a blanket manner. The cap layer 112 is formed directly on the plug material layer 110. According to one embodiment of the invention, the plug material layer 110 may comprise conductive materials such as doped polysilicon or metals, preferably, doped polysilicon. For example, the plug material layer 110 may be a doped polysilicon layer deposited by using a Balanced Controlled Deposition (BCD) method, but is not limited thereto. The cap layer 112 may comprise an insulating material, for example, silicon oxide, but is not limited thereto.

According to one embodiment of the invention, before depositing the plug material layer 110, an etching process or a cleaning process may be performed to remove any pad layers (e.g., pad oxide or pad nitride) or native oxide from the top surface 10a of the semiconductor substrate 10 to expose top surfaces of the active areas 12. According to one embodiment of the invention, the plug material layer 110 is in direct contact with the exposed top surfaces of the active areas 12.

Subsequently, as best seen in FIG. 1 and FIG. 2, columns of line-shaped buried word lines (BWLs) 16 are fabricated in the semiconductor substrate 10. The columns of line-shaped buried word lines (BWLs) 16 extend along a reference y-axis, and two buried word lines 16 intersect with each active area 12, thereby separating each active area 12 into three portions including a digit line contact area 12a and two cell contact areas (or capacitor landing areas) 12b. The two cell contact areas 12b are located at two distal ends of each active area 12, and the digit line contact area 12a is located between two line-shaped buried word lines 16.

To form the buried word lines (BWLs) 16, conventional lithographic processes may be performed to form a photoresist pattern (not shown) on the cap layer 112. The photoresist pattern defines word line trench patterns to be etched into the semiconductor substrate 10. Using the photoresist pattern as a hard mask, a dry etching process is performed to etch the plug material layer 110, the cap layer 112, the STI structures 14, and the semiconductor substrate 10 to thereby form word line trenches 160. The columns of line-shaped word line trenches 160 extend along a reference y-axis and pass through the active areas 12 and the STI structures 14.

When forming the line-shaped word line trenches 160, line-shaped plug patterns 110' are also formed intermittently between the columns of line-shaped word line trenches 160 in a self-aligned manner i.e., no extra photomask is needed). Each of the line-shaped plug patterns 110' completely overlaps with the digit line contact areas 12a and the cell contact areas 12b along the reference y-axis. Each of the line-shaped plug patterns 110' is in direct contact with the digit line contact areas 12a and the cell contact areas 12b along the reference y-axis. Each of the line-shaped plug patterns 110' is also in direct contact with the STI structures 14 intermittently along the reference y-axis.

As can be best seen in FIG. 2, a gate dielectric layer 164 is formed on an interior surface of each word line trench 160 and a conductive portion 162 is embedded at a lower portion of each word line trench 160. The conductive portion 162 may comprise a layer of metal, metal composite or layers of conductive materials. For example, the conductive portion 162 may comprise titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof.

The conductive portion 162 is encapsulated by the gate dielectric layer 164 such as silicon oxide lining the interior surface of each word line trench 160 and an insulating layer 166 situated atop the conductive portion 162. At this point, the insulating layer 166 has a top surface that is flush with a top surface of the cap layer 112. For example, the insulating layer 166 may comprise silicon oxide, silicon nitride, or silicon oxy-nitride, but is not limited thereto. According to the embodiment, the dopants in the line-shaped plug patterns 110' may diffuse into the active areas 12 to thereby form source or drain regions, which are not shown in figures for the sake of simplicity.

Figure 2A:
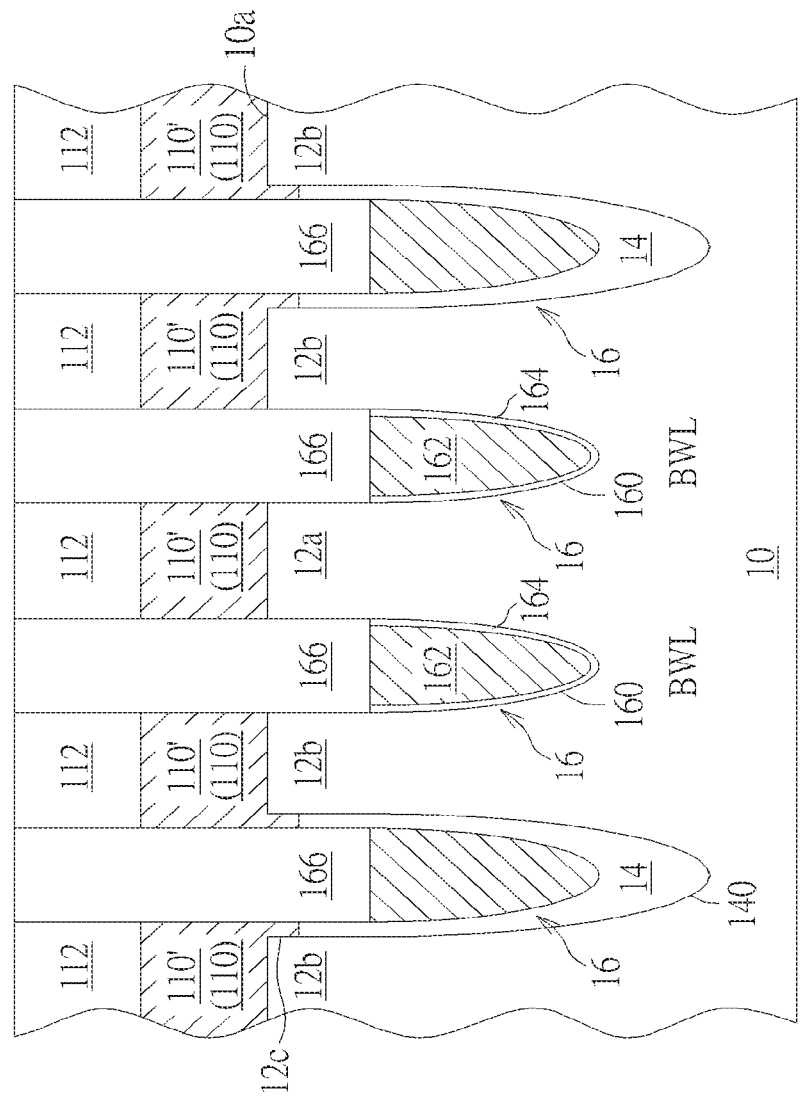
Figure 3A:
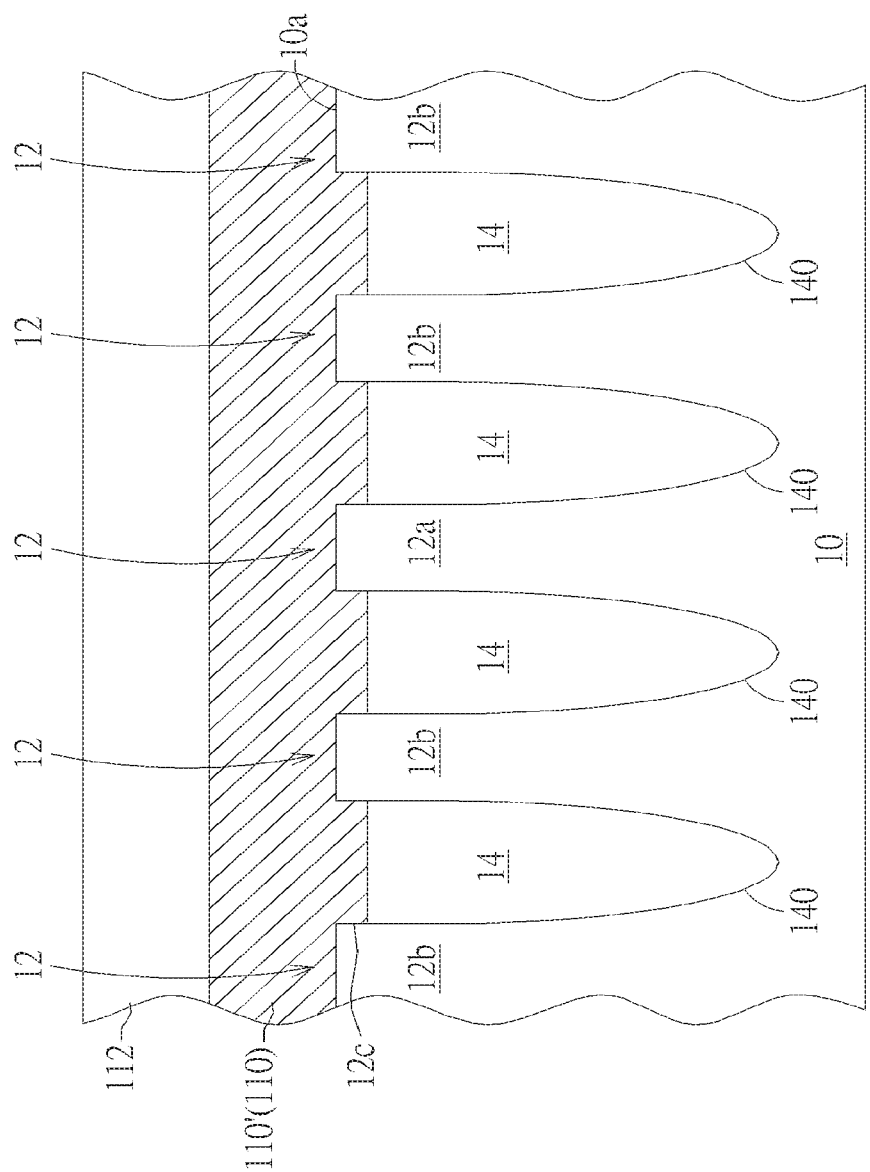

Please refer to FIG. 2A and FIG. 3A. FIG. 2A and FIG. 3A are schematic diagrams illustrating a process for fabricating three-dimensional (3D) contact plugs in accordance with another embodiment of this invention. As shown in FIG. 2A and FIG. 3A, according to the embodiment, before depositing the plug material layer 110, the top surface of each STI structure 14 is recessed or etched to a horizontal plane that is lower than the top surface of each active area 12, thereby forming a 0-500 angstrom step height between the STI structure 14 and the active areas 12. Each active area 12 slightly protrudes from the top surface of the active areas 12. A sidewall 12c of each active area 12 is exposed. After recessing the STI structure 14, the plug material layer 110 is deposited. The exposed sidewall 12c of each active area 12 is in direct contact with the plug material layer 110. Therefore, the contact area is increased.

Subsequently, columns of line-shaped buried word lines (BWLs) 16 are fabricated in the semiconductor substrate 10. The columns of line-shaped buried word lines (BWLs) 16 extend along a reference y-axis, and two buried word lines 16 intersect with each active area 12, thereby separating each active area 12 into three portions including a digit line contact area 12a and two cell contact areas 12b. The two cell contact areas 12b are located at two distal ends of each active area 12, and the digit line contact area 12a is located between two line-shaped buried word lines 16.

To form the buried word lines (BWLs) 16, conventional lithographic processes may be performed to form a photoresist pattern (not shown) on the cap layer 112. The photoresist pattern defines word line trench patterns to be etched into the semiconductor substrate 10. Using the photoresist pattern as a hard mask, a dry etching process is performed to etch the plug material layer 110, the cap layer 112, the STI structures 14, and the semiconductor substrate 10 to thereby form word line trenches 160. The columns of line-shaped word line trenches 160 extend along a reference y-axis and pass through the active areas 12 and the STI structures 14.

When forming the line-shaped word line trenches 160, line-shaped plug patterns 110' are also formed intermittently between the columns of line-shaped word line trenches 160 in a self-aligned manner (i.e., no extra photomask is needed). Each of the line-shaped plug patterns 110' completely overlaps with the digit line contact areas 12a and the cell contact areas 12b along the reference y-axis. Each of the line-shaped plug patterns 110' is in direct contact with the digit line contact areas 12a and the cell contact areas 12b along the reference y-axis. Each of the line-shaped plug patterns 110' is also in direct contact with the STI structures 14 intermittently along the reference y-axis. The following fabrication steps are similar to that described through FIG. 4 to FIG. 29.

Figure 4:
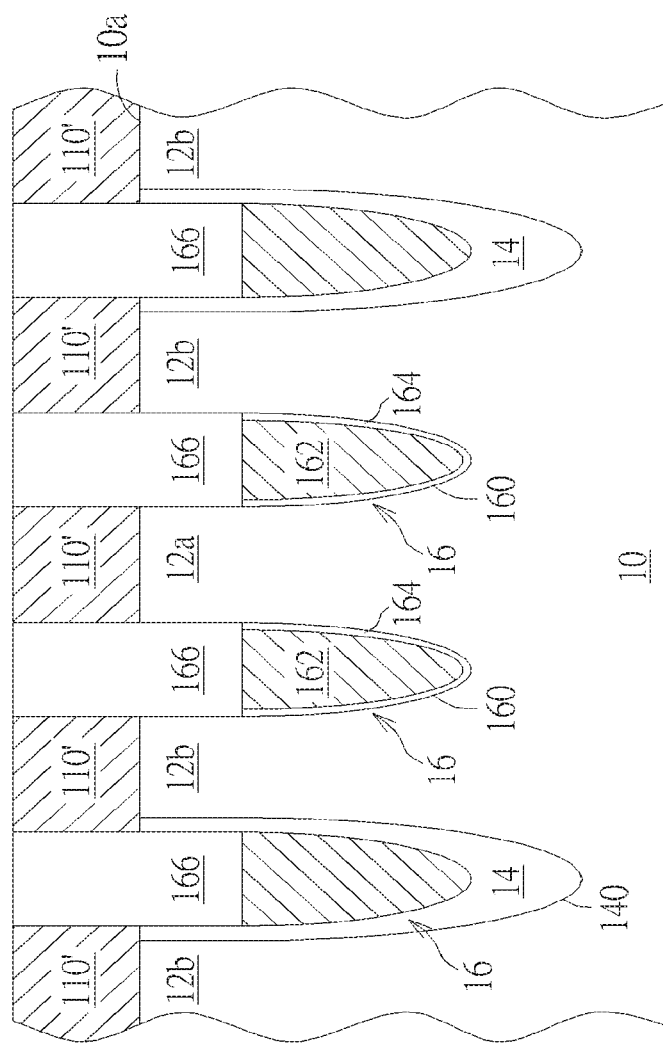
Figure 5:
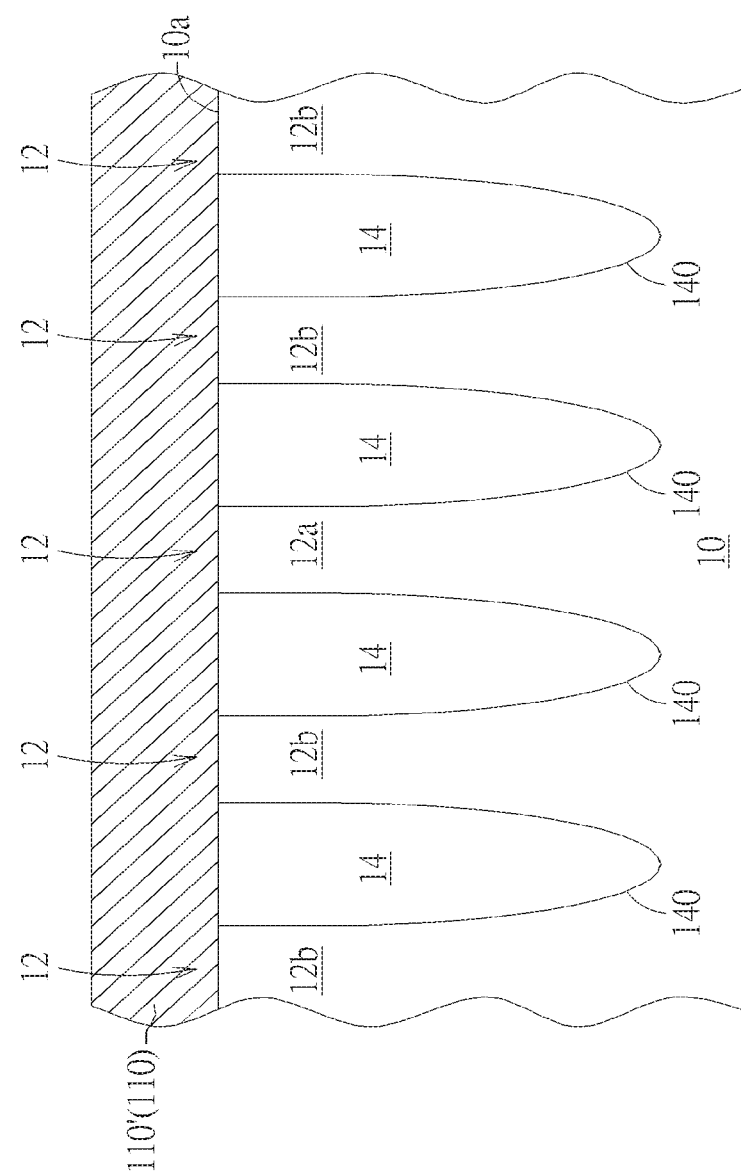

Please refer to FIG. 4 and FIG. 5. FIG. 4 and FIG. 5 are schematic, cross-sectional views taken along line I-I' and II-II', respectively, in FIG. 1, after removing the cap layer 112 during the manufacture of the memory device according to one embodiment of the invention. As shown in FIG. 4 and FIG. 5, after forming the insulating layer 166 atop each conductive portion 162, a polishing process, such as a CMP process is performed to remove the cap layer 112 and an upper portion of the insulating layer 166, thereby exposing the top surfaces of the plug patterns 110'. After removing the cap layer 112, the exposed the top surfaces of the plug patterns 110' are flush with the top surface of the insulating layer 166.

Figure 6:
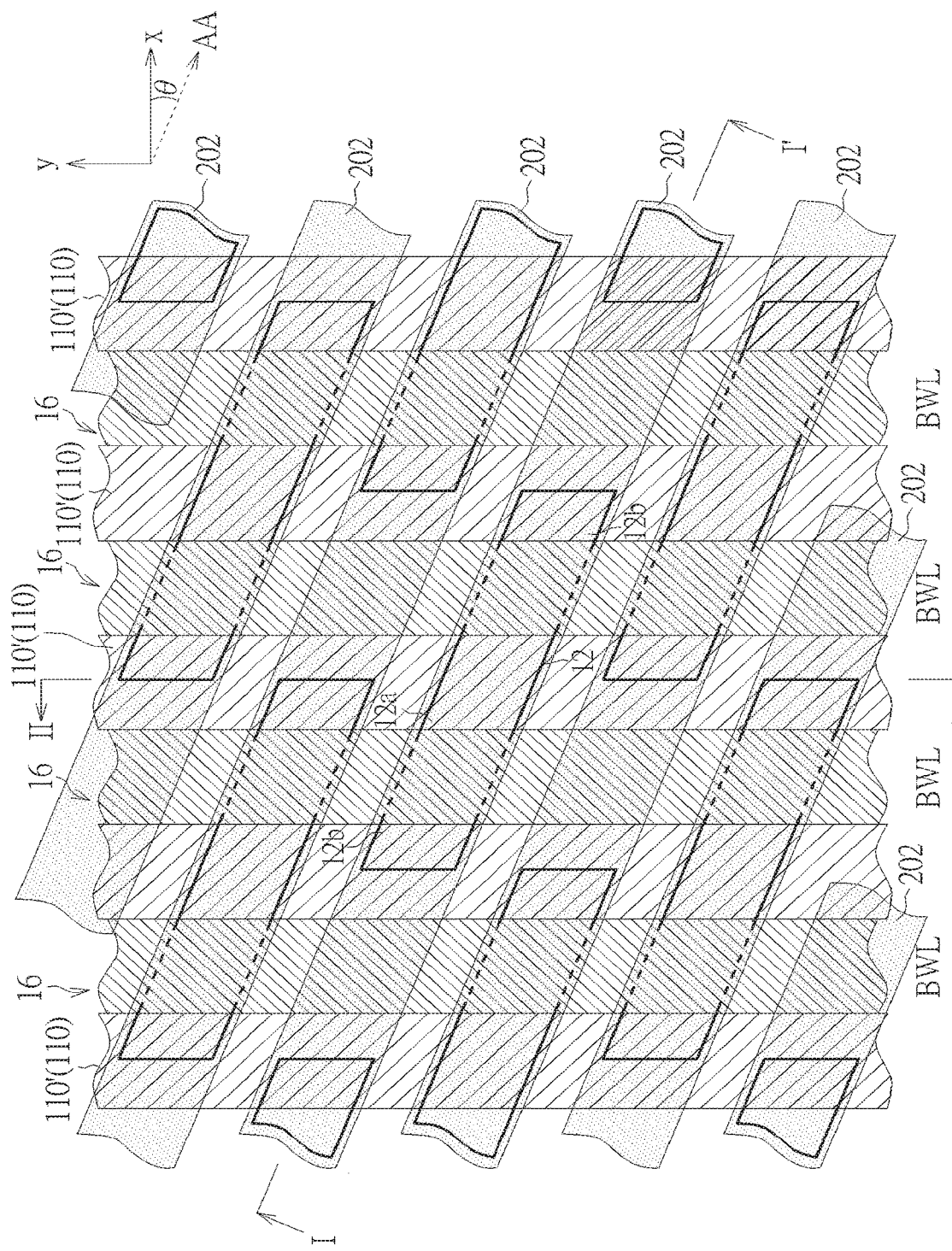
Figure 7:
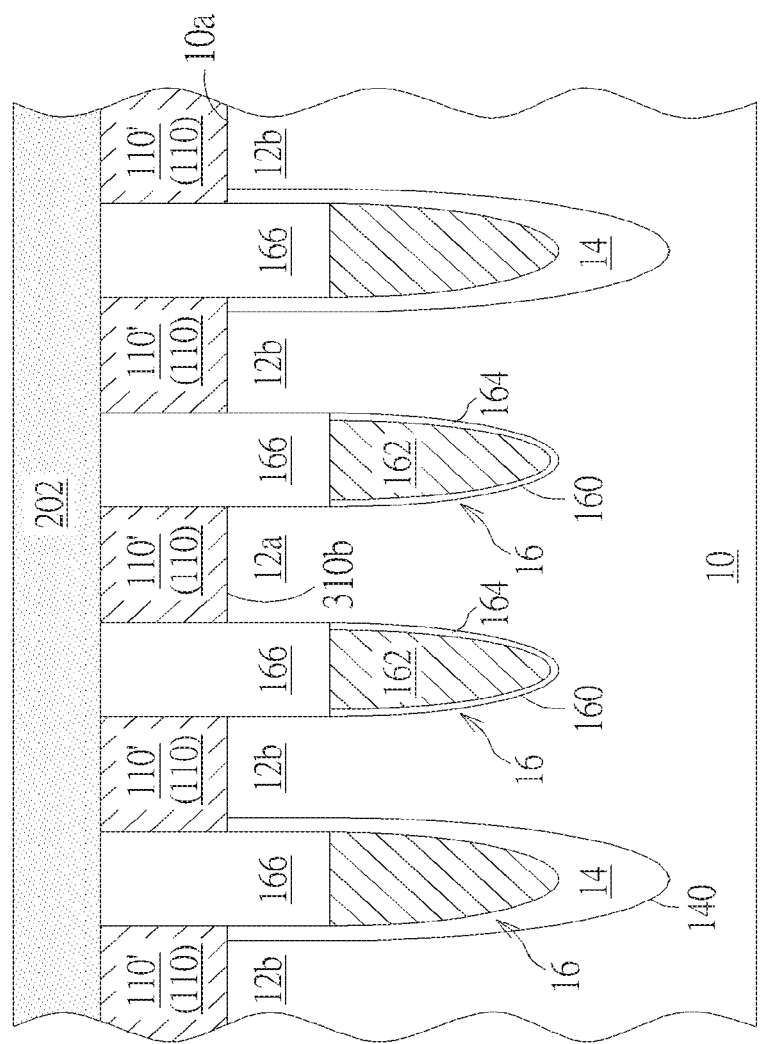
Figure 8:
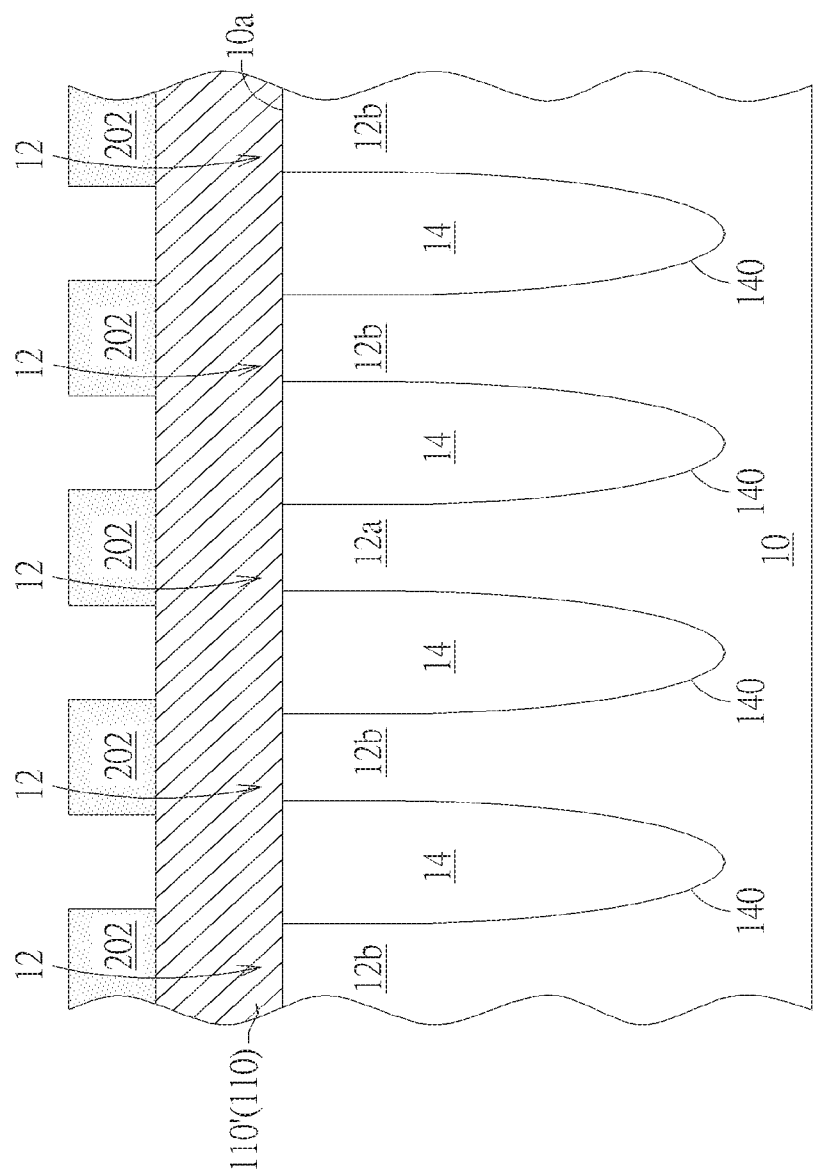

Please refer to FIG. 6 to FIG. 8. FIG. 6 is a top view of the schematic layout of the memory array of the memory device after the formation of line-shaped photoresist patterns along the reference AA direction according to one embodiment of the invention. FIG. 7 and FIG. 8 are schematic, cross-sectional views taken along line I-I' and II-II', respectively, in FIG. 6. As shown in FIG. 6 to FIG. 8, after removing the cap layer 112 by CMP, a plurality of line-shaped photoresist patterns 202 are formed on the top surfaces of the plug patterns 110' and on the top surface of the insulating layer 166 along the reference AA direction. Each of the line-shaped photoresist patterns 202 completely overlaps with the active areas 12 aligned along the reference AA direction.

Figure 9:
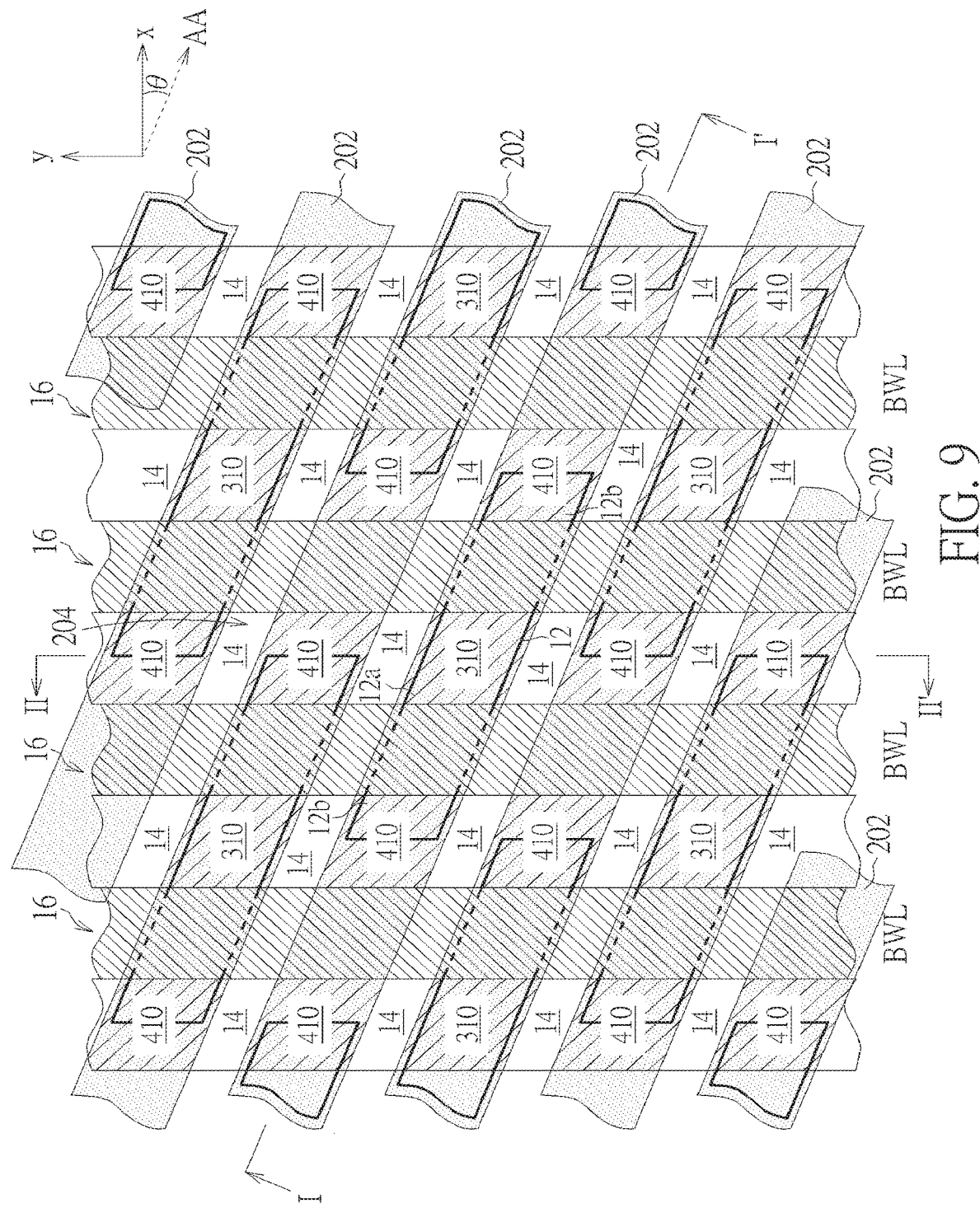
Figure 10:
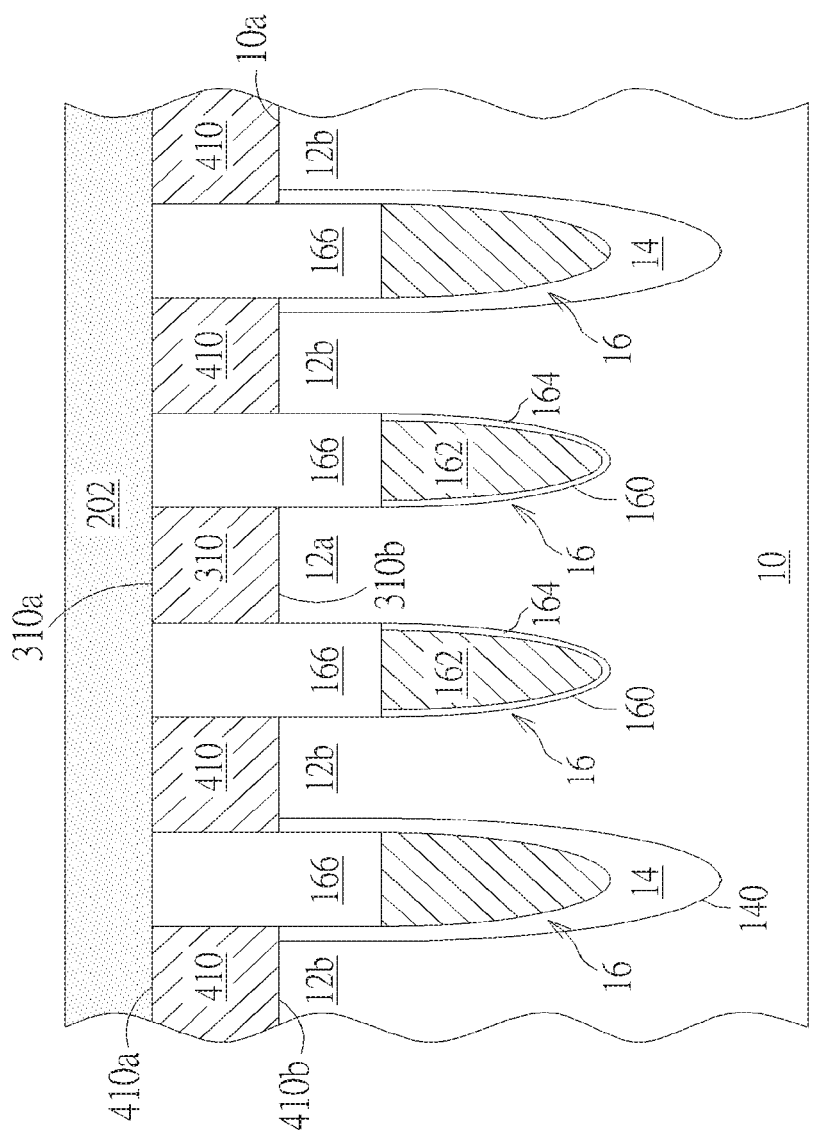
Figure 11:
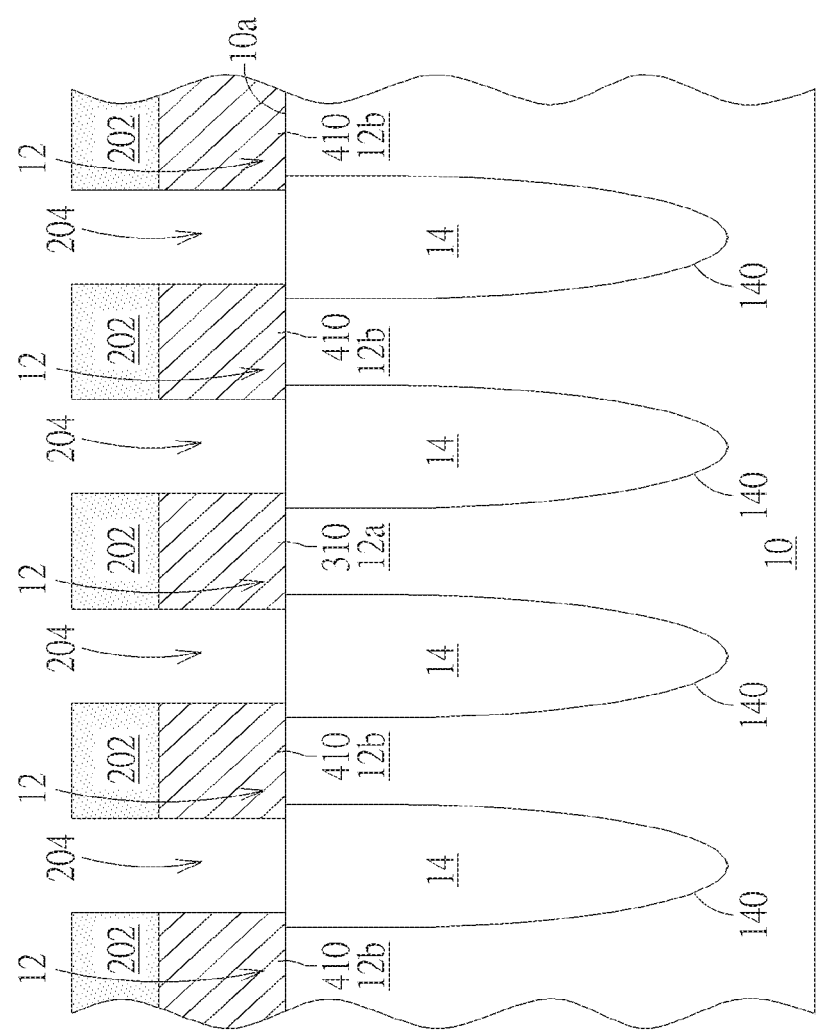

Please refer to FIG. 9 to FIG. 11. FIG. 9 is a top view of the schematic layout of the memory array of the memory device after etching the line-shaped plug patterns 110' not covered by the line-shaped photoresist patterns 202 according to one embodiment of the invention. FIG. 10 and FIG. 11 are schematic, cross-sectional views taken along line I-I' and II-II', respectively, in FIG. 9. As shown in FIG. 9 to FIG. 11, after the formation of the line-shaped photoresist patterns 202 along the reference AA direction, an anisotropic dry etching process may be performed to etch the line-shaped plug patterns 110' not covered by the line-shaped photoresist patterns 202, thereby cutting the line-shaped plug patterns 110' into digit line contact plugs 310 and cell contact plugs 410. After etching away the plug patterns 110' not covered by the line-shaped photoresist patterns 202, portions of the STI structures 14 are exposed. After etching away the plug patterns 110' not covered by the line-shaped photoresist patterns 202, the line-shaped photoresist patterns 202 are removed by using methods known in the art.

According to one embodiment of the invention, each of the digit line contact areas 12a is completely covered with each of the digit line contact plugs 310. Each of the cell contact areas 12b is completely covered with each of the cell contact plugs 410. It is one technical feature of the invention that the digit line contact plugs 310 and the cell contact plugs 410 are coplanar and are formed at the same time. Each of the digit line contact plugs 310 has a top surface 310a and a bottom surface 310b. Each of the cell contact plugs 410 has a top surface 410a and a bottom surface 410b. The top surface 310a is flush with the top surface of the insulating layer 166 and the top surface 410a. The bottom surface 310b is flush with the bottom surface 410b. The bottom surface 310b, the bottom surface 410b, and the top surface 10a of the semiconductor substrate 10 are coplanar (or in substantially the same horizontal plane).

As shown in FIG. 9 and FIG. 11, after etching away the plug patterns 110' not covered by the line-shaped photoresist patterns 202, recessed trenches 204 are formed in place between the digit line contact plugs 310 and the cell contact plugs 410 intermittently along the reference y-axis. It is another feature of the invention that the surface area of each of the cell contact plugs 410 is greater than the surface area of each cell contact area 12b, and the surface area of each of the digit line contact plugs 310 is greater than the surface area of each digit line contact area 12a.

Figure 12:
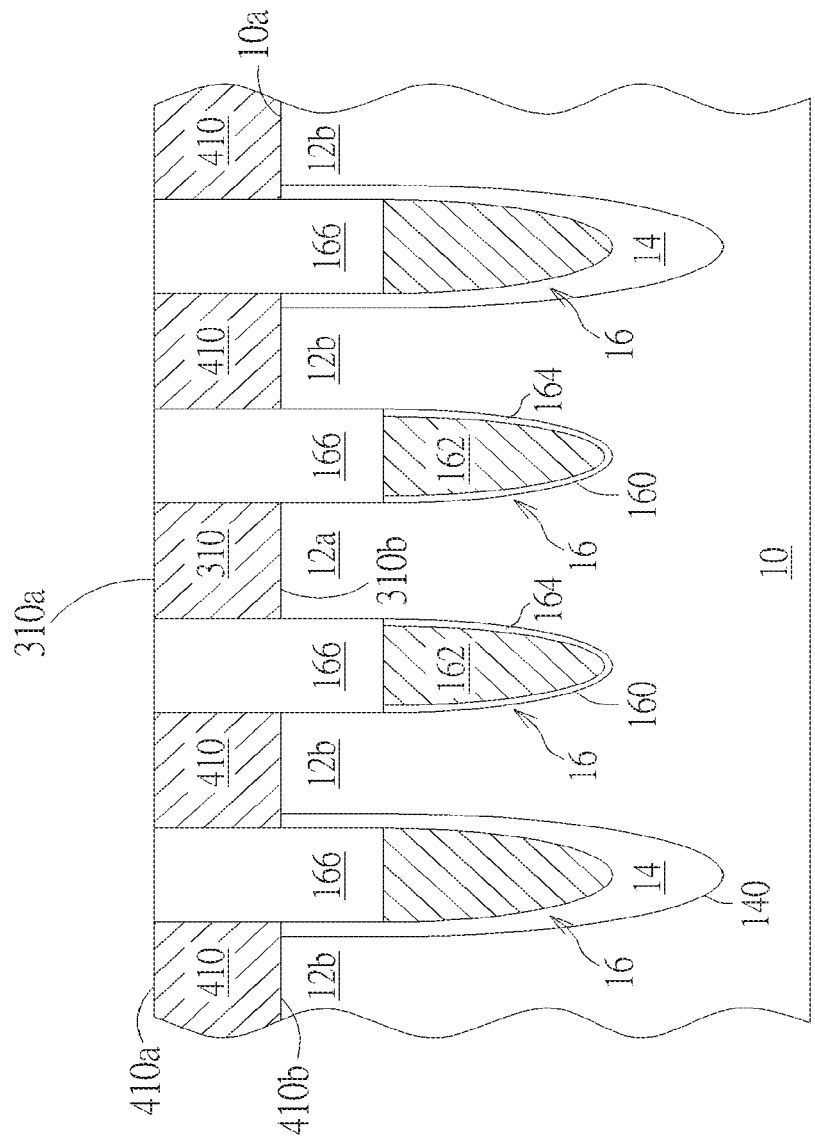
Figure 13:
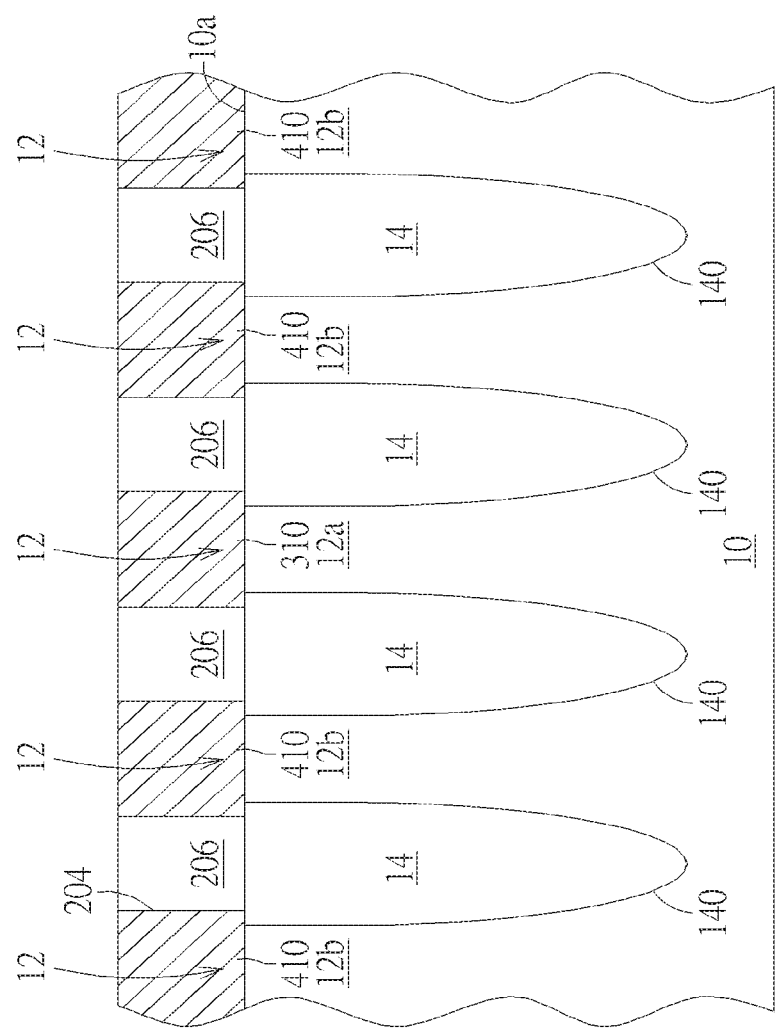

Please refer to FIG. 12 and FIG. 13. FIG. 12 and FIG. 13 are schematic, cross-sectional views taken along line I-I' and II-II', respectively, in FIG. 9, after removing the line-shaped photoresist patterns 202 and after filling up the recessed trenches 204 with an insulating layer. As shown in FIG. 12 and FIG. 13, after removing the line-shaped photoresist patterns 202, a chemical vapor deposition (CVD) process or atomic layer deposition (ALD) process may be performed to deposit an insulating layer 206 on the semiconductor substrate 10 in a blanket manner. The insulating layer 206 may comprise silicon oxide, but is not limited thereto. The insulating layer 206 fills up the recessed trenches 204. The excess insulating layer 206 outside the recessed trenches 204 may be removed by CMP methods to expose the top surfaces of the digit line contact plugs 310 and the cell contact plugs 410. At this point, a top surface of the insulating layer 206 is flush with the top surfaces of the digit line contact plugs 310 and the cell contact plugs 410.

Figure 14:
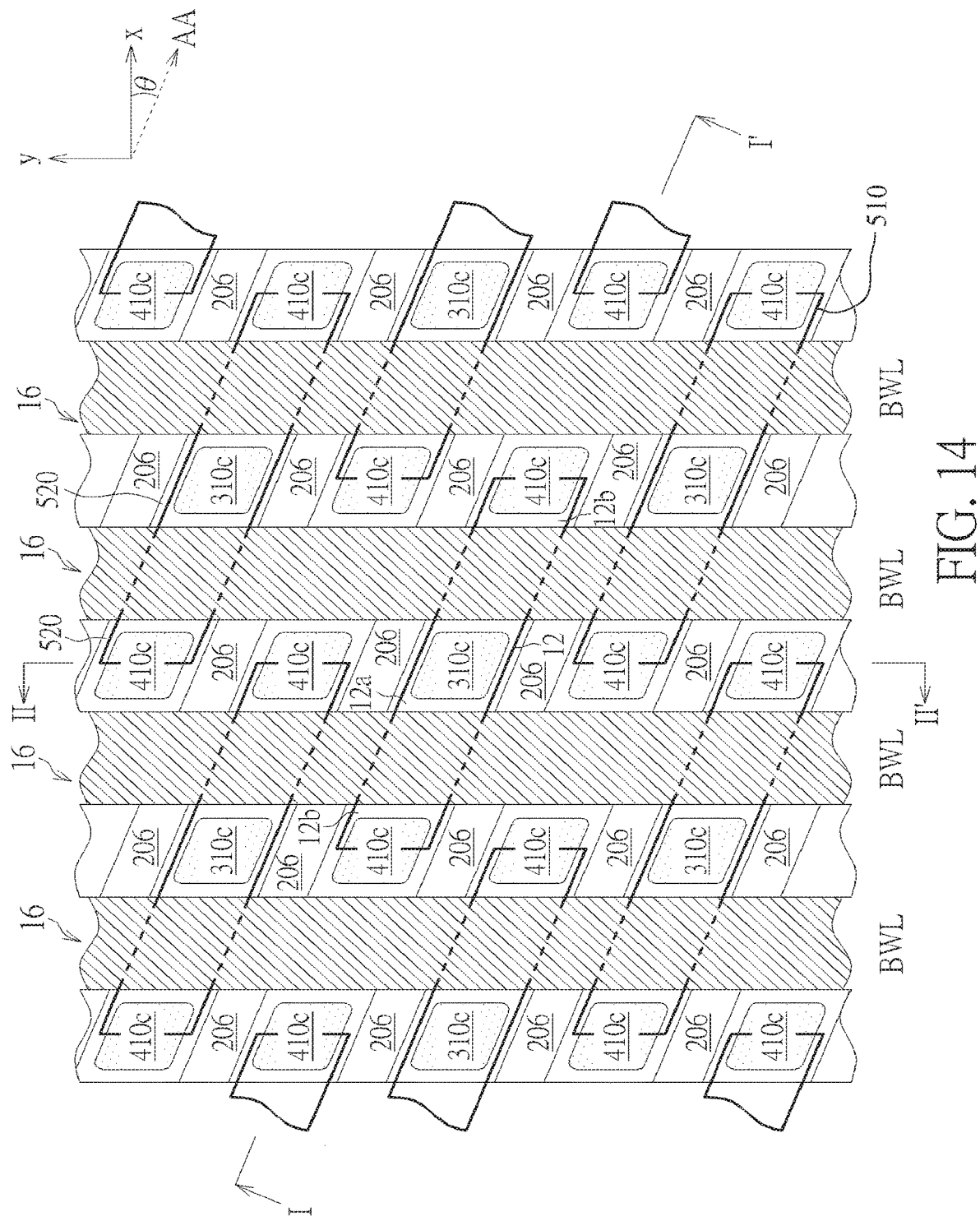
Figure 15:
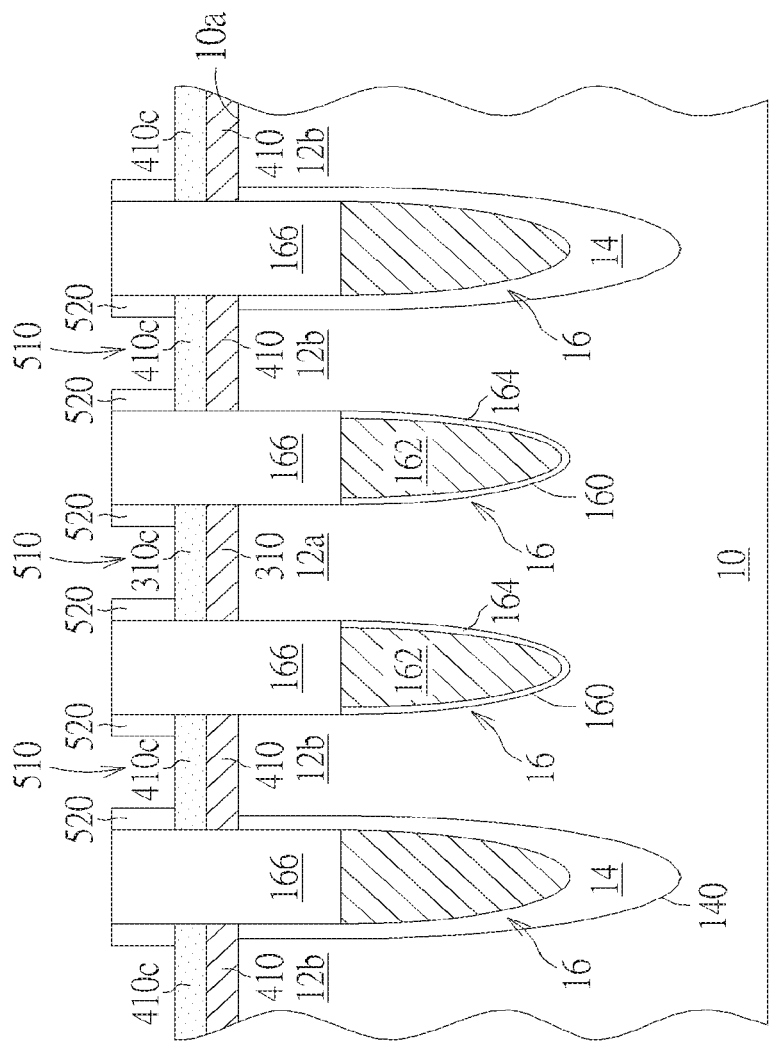
Figure 16:
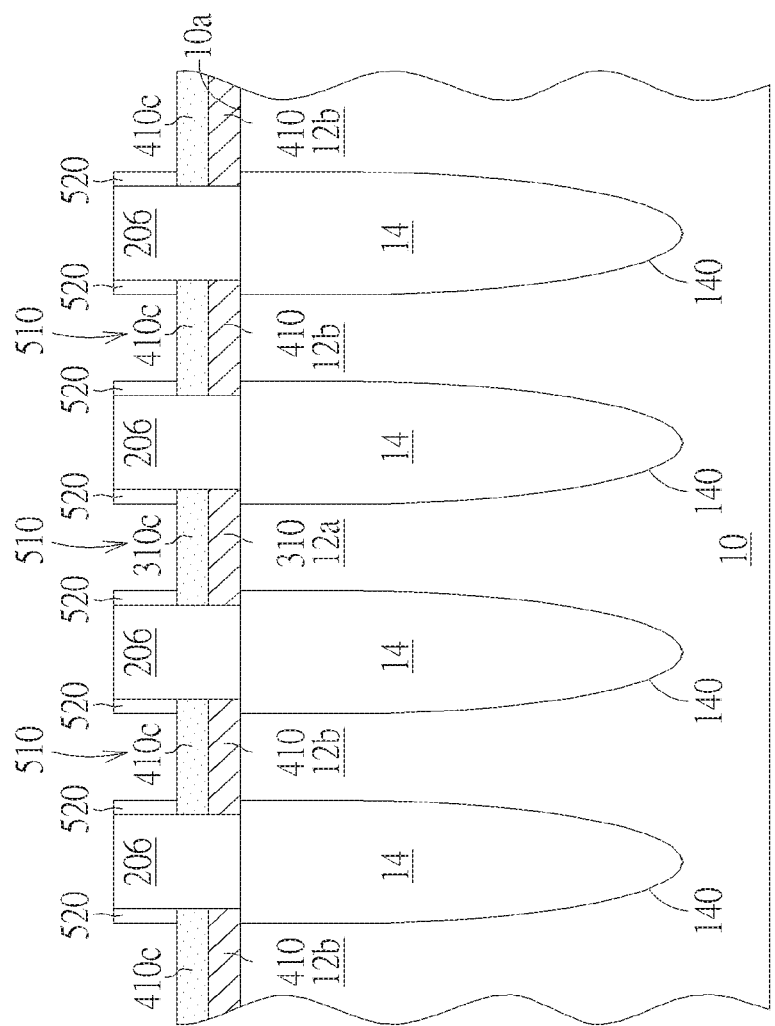

Please refer to FIG. 14 to FIG. 16. FIG. 14 is a top view of the schematic layout of the memory array of the memory device after recessing the digit line contact plugs 310 and the cell contact plugs 410 and after forming an annular spacer 520 according to one embodiment of the invention. FIG. 15 and FIG. 16 are schematic, cross-sectional views taken along line I-I' and II-II', respectively, in FIG. 14. As shown in FIG. 14 to FIG. 16, after filling up the recessed trenches 204 with the insulating layer 206, the top surfaces of the digit line contact plugs 310 and the cell contact plugs 410 are recessed to a predetermined level that is lower than the top surface of the insulating layer 166 and the top surface of the insulating layer 206, thereby forming a recessed area 510 directly above each of the digit line contact plugs 310 and the cell contact plugs 410.

The top surfaces of the digit line contact plugs 310 and the cell contact plugs 410 may be recessed to the predetermined level by a selective dry etching process that selectively etches the doped polysilicon of the digit line contact plugs 310 and the cell contact plugs 410, but does not etch (or only slightly etches) the surrounding silicon oxide of the insulating layer 166 and the insulating layer 206. According the embodiment of the invention, the remaining thickness of the digit line contact plugs 310 and the cell contact plugs 410 may range, for example, between 0 angstroms and 2000 angstroms. As can be best seen in FIG. 14, each recessed area 510 has a parallelogram shape with two opposite sidewalls of the insulating layer 206 along the reference AA direction and two opposite sidewalls of the insulating layer 206 along the reference y-axis.

According to one embodiment of the invention, each digit line contact plug 310 may further comprise an intermediate metal layer 310c. According to one embodiment of the invention, each cell contact plug 410 may further comprise an intermediate metal layer 410c. For example, to form the intermediate metal layer 310c and the intermediate metal layer 410c, a metal layer including, but not limited to, tungsten, titanium, titanium nitride, or cobalt, may be deposited in a blanket manner. The metal layer completely fills up the recessed areas 510. The metal layer is then etched to reveal the insulating layer 166 and the insulating layer 206. Likewise, the top surface of the metal layer is recessed to a predetermined level that is lower than the top surface of the insulating layer 166 and the top surface of the insulating layer 206.

After forming the recessed area 510 directly above each of the digit line contact plugs 310 and the cell contact plugs 410, a deposition process such as a CVD process or ALD process may be carried out to conformally deposit a spacer material layer (not explicitly shown), for example, silicon oxide layer, on the semiconductor substrate 10 in a blanket manner. An anisotropic dry etching process is then performed to etch the spacer material layer until the top surface of the intermediate metal layer 310c or the intermediate metal layer 410c is exposed, thereby forming a continuous, annular spacer 520 within each recessed area 510. As shown in FIG. 15 and FIG. 16, the continuous, annular spacer 520 is formed directly on the top surface of the intermediate metal layer 310c or the intermediate metal layer 410c.

Figure 17:
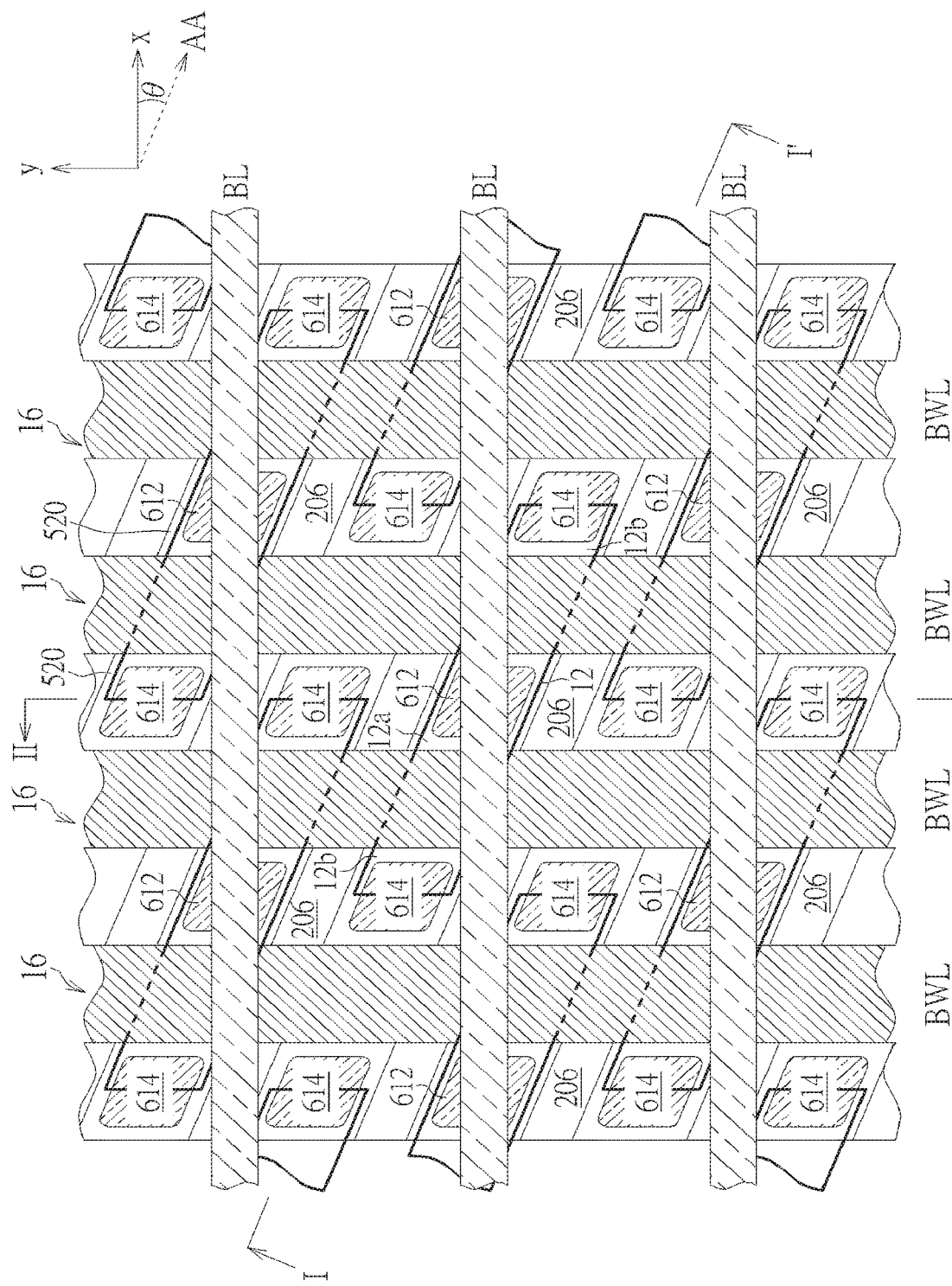
Figure 18:
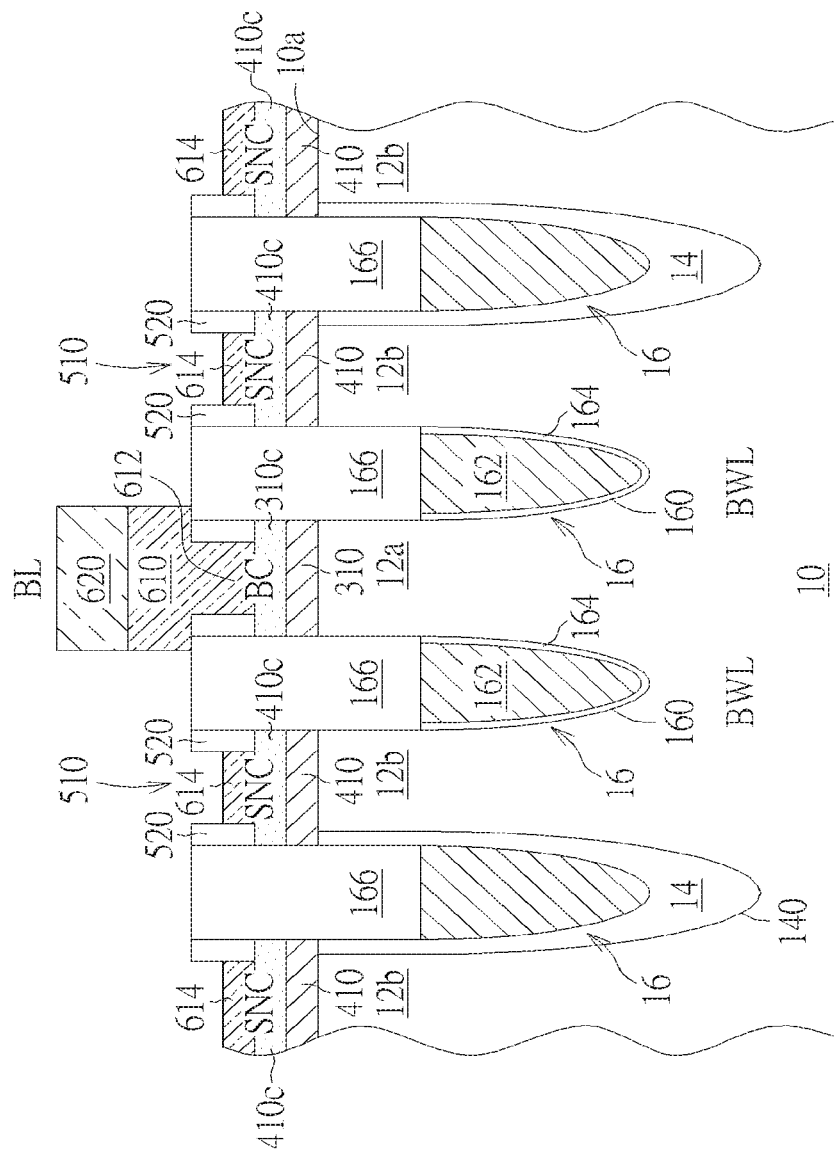
Figure 19:
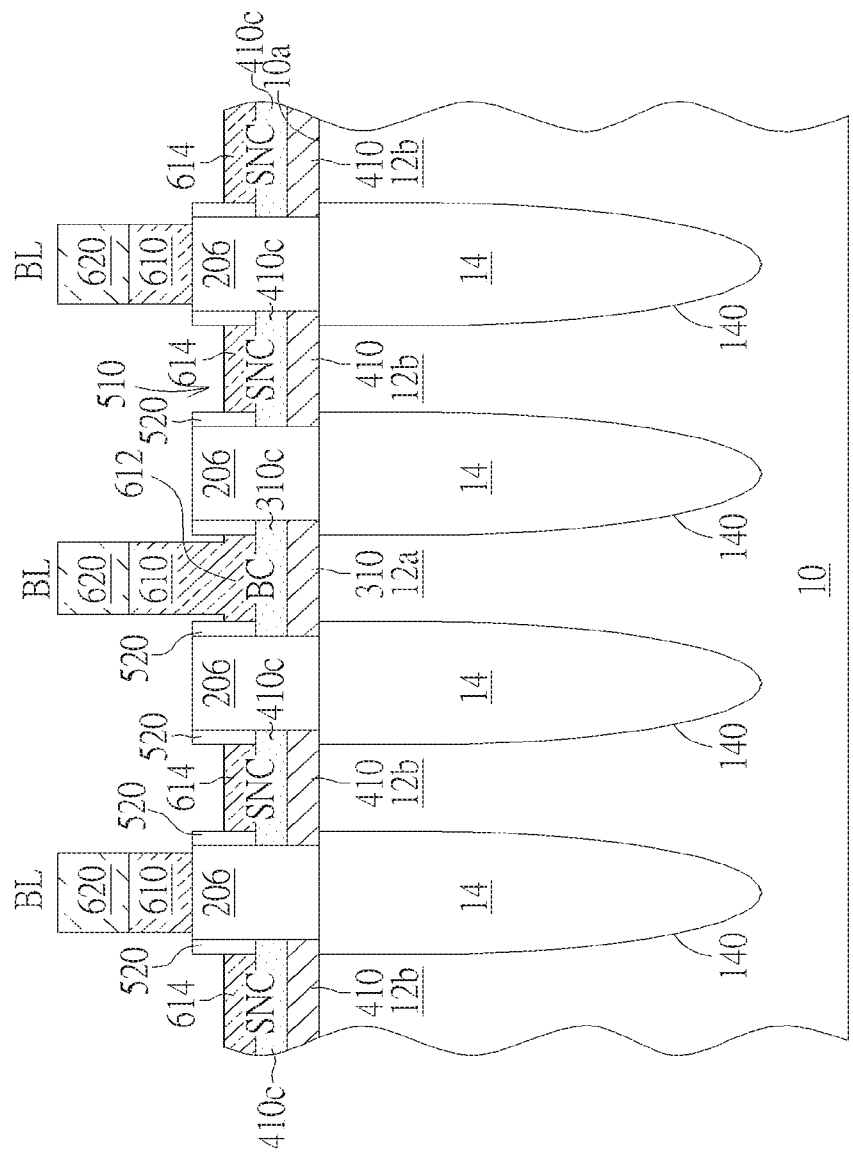

Please refer to FIG. 17 to FIG. 19. FIG. 17 is a top view of the schematic layout of the memory array of the memory device after forming digit lines or bit lines (BLs) electrically connected to the digit line contact plugs 310 along the reference x-axis according to one embodiment of the invention. FIG. 18 and FIG. 19 are schematic, cross-sectional views taken along line I-I' and II-II', respectively, in FIG. 17. As shown in FIG. 17 to FIG. 19, rows of bit lines (BLs) are formed. Each of the bit lines extends along the reference x-axis and is electrically connected to the digit line contact plugs 310 in the same row. Each of the bit lines may comprise a metal layer 610 and a mask layer 620 situated directly on the metal layer 610. According to the embodiment, the metal layer 610 may comprise tungsten, titanium, titanium nitride or the like, but is not limited thereto.

To form the bit lines, conventional CVD processes, PVD processes, lithographic processes, and etching processes may be performed. By way of example, first, a metal film such as tungsten may be deposited onto the semiconductor substrate 10 in a blanket manner. The metal film fills up the recessed areas 510. A hard mask layer such as silicon nitride layer is then deposited onto the metal film. A lithographic process is then performed to form a patterned photoresist on the hard mask layer. A dry etching process is then performed to etch the hard mask layer and the metal film until the top surface of the insulating layer 166 is exposed.

When forming the bit lines, metal plugs 612 and metal plugs 614 are concurrently formed in the recessed areas 510 above the top surface of the intermediate metal layer 310c and the intermediate metal layer 410c, respectively. It is noteworthy that the metal plug 612 is integrally formed with the metal layer 610 of each bit line (BL). The metal plug 612 is embedded only in the recessed area 510 and is situated only directly above each of the intermediate metal layer 310c. The metal plug 614 is embedded only in the recessed area 510 and is situated only directly above each of the intermediate metal layer 410c. Each of the annular spacers 520 surrounds each of the metal plugs 612 and metal plugs 614 directly above the intermediate metal layer 310c and the intermediate metal layer 410c, respectively.

As shown in FIG. 18 and FIG. 19, the metal plug 612 is in direct contact with the intermediate metal layer 310c and the metal plug 614 is in direct contact with the intermediate metal layer 410c. The metal plug 612 and the intermediate metal layer 310c may be composed of the same material or different materials. The metal plug 614 and the intermediate metal layer 410c may be composed of the same material or different materials. In some embodiments, in a case that the digit line contact plug 310 and the cell contact plug 410 both comprise polysilicon, a metal silicide layer (not explicitly shown) may be formed between the intermediate metal layer 310c and the digit line contact plug 310 and between the intermediate metal layer 410c and the cell contact plug 410.

According to the embodiment, the top surface of each metal plug 614 may be lower than the top surface of the insulating layer 166 and the top surface of the annular spacer 520 to ensure separation of the metal plug 614 from the metal plug 612. According to the embodiment, the metal plug 612 is separated from the metal plug 614 by the insulating layer 206 and the annular spacer 520. According to the embodiment, the metal plug 612 and the metal plug 614 are coplanar and are formed from the same metal layer.

The metal plug 612 and the digit line contact plug 310 constitute a low-resistance digit line contact (BC) for electrically connecting the respective integral bit line (BL) with the digit line contact area 12a. The metal plug 614 and the cell contact plug 410 constitute a low-resistance storage node contact (SNC) for electrically connecting a storage node of a respective capacitor with the cell contact area 12b. The digit line contact and the storage node contact are coplanar.

It is advantageous to incorporate the intermediate metal layers 310c and 410c because a maximized contact area between the metal layer and the polysilicon (i.e., digit line contact plug 310 and the cell contact plug 410) may be obtained and the contact resistance is reduced. According to one embodiment, it is one structural feature that the digit line contact (BC) and the storage node contact (SNC) both comprise one polysilicon layer (i.e., digit line contact plug 310 and the cell contact plug 410) and two metal layers (i.e., the intermediate metal layer 310c and the metal plug 612, the intermediate metal layer 410c and the metal plug 614). The two metal layers may be composed of the same materials, or may be composed of different materials. The intermediate metal layers 310c and 410c are coplanar. The metal plugs 612 and 614 are coplanar.

Figure 20:
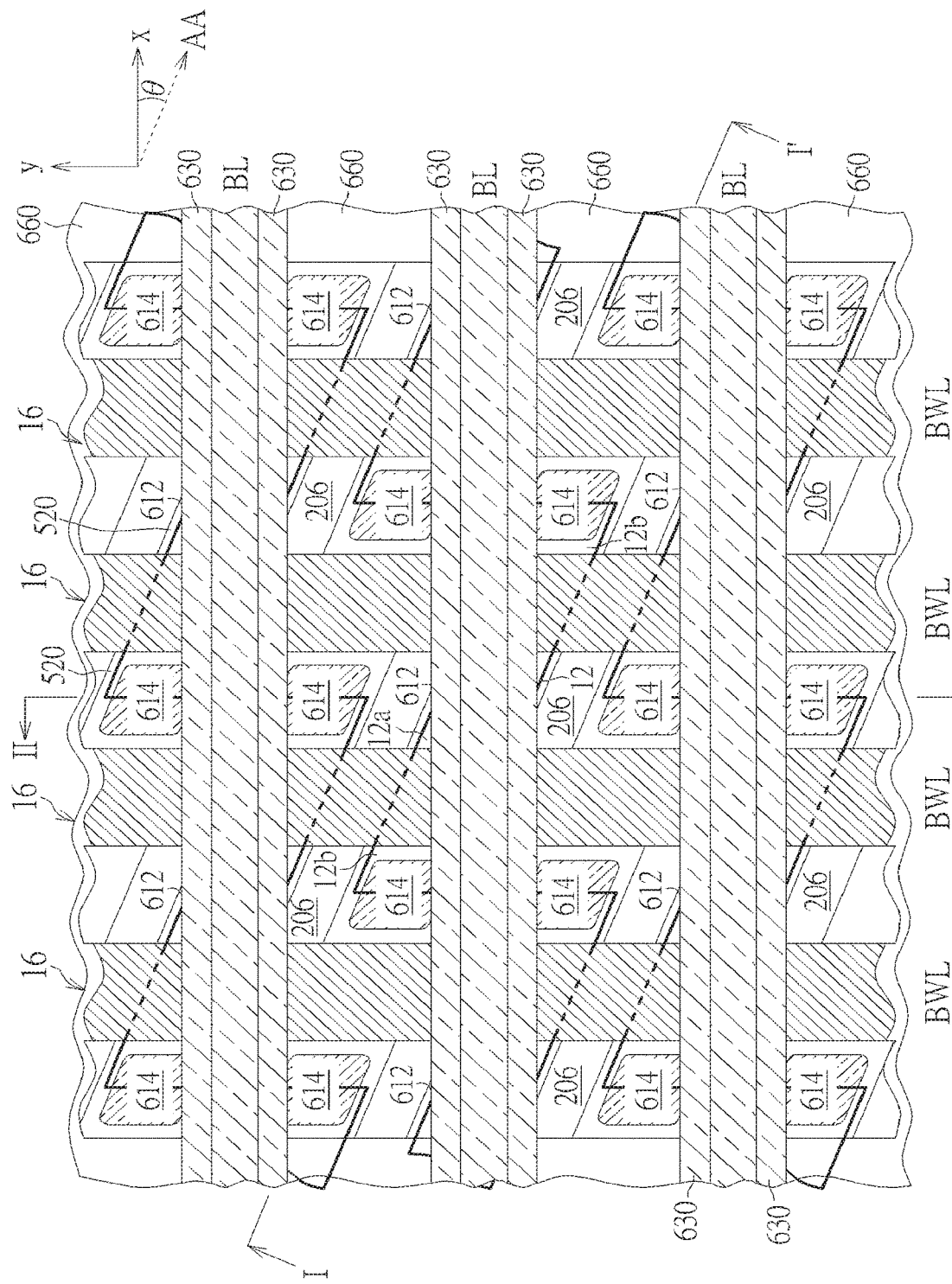
Figure 21:
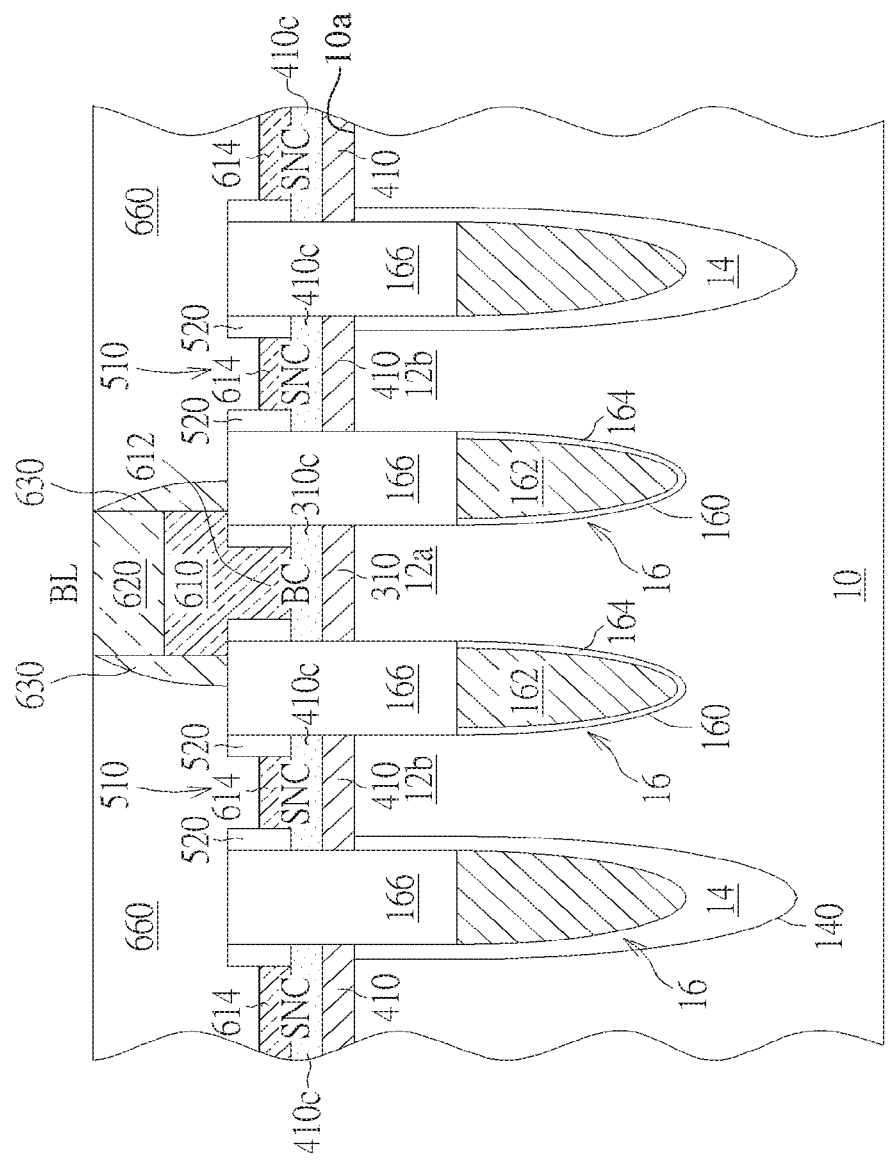
Figure 22:
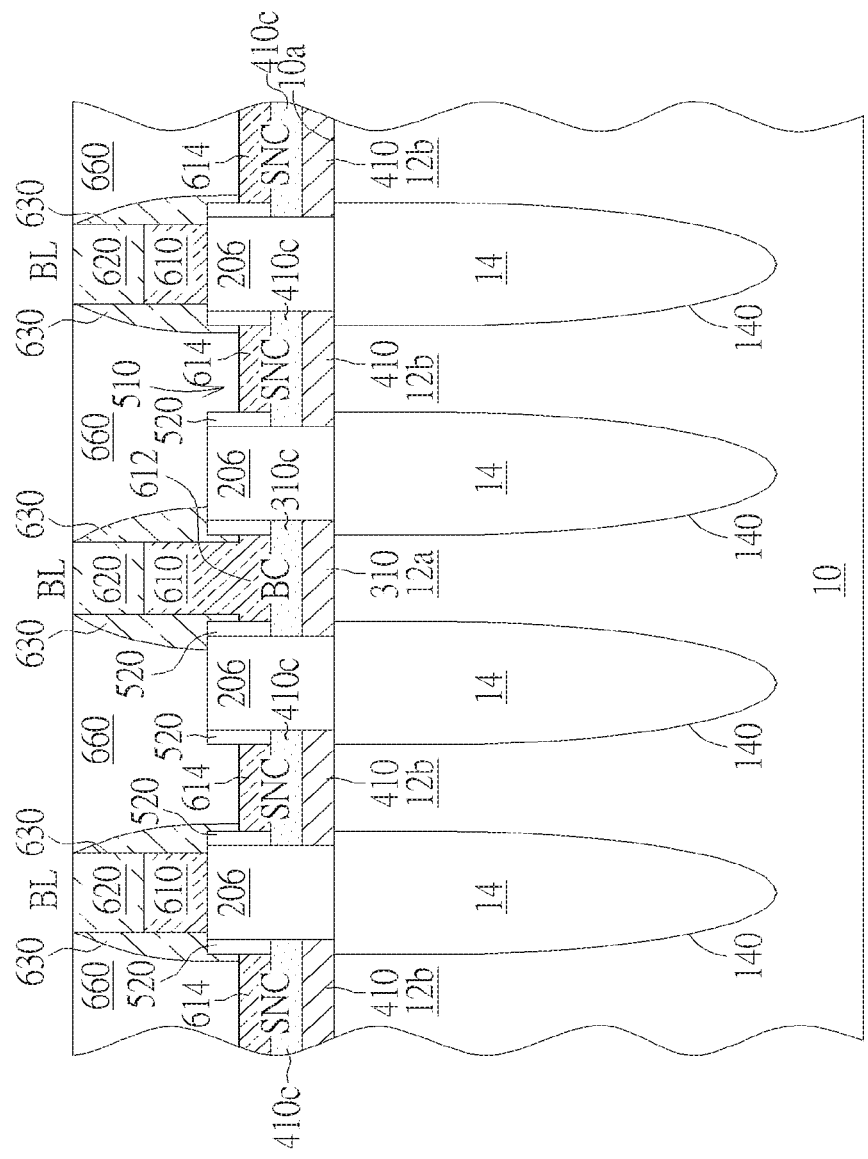

Please refer to FIG. 20 to FIG. 22. FIG. 20 is a top view of the schematic layout of the memory array of the memory device after forming sidewall spacers 630 and inter-layer dielectric (ILD) layer 660 according to one embodiment of the invention. FIG. 21 and FIG. 22 are schematic, cross-sectional views taken along line I-I' and II-II', respectively, in FIG. 20. As shown in FIG. 20 to FIG. 22, after forming the digit lines or bit lines (BLs) and the metal plugs 612, 614, sidewall spacers 630 such as silicon nitride spacers are formed on the opposite sidewalls of each of the bit lines. To form the sidewall spacers 630, for example, a conformal silicon nitride layer is deposited onto the semiconductor substrate 10 in a blanket manner, followed by dry etching the conformal silicon nitride layer. The sidewall spacers 630 insulate the bit lines.

Subsequently, an inter-layer dielectric (ILD) layer 660 such as a spin-on dielectric (SOD) layer or TEOS oxide layer is formed onto the semiconductor substrate 10 in a blanket manner. The ILD layer 660 fills up the spacing between the bit lines and covers top surfaces of the bit lines. A polishing process such as a CMP process is then performed to polish the ILD layer 660 until the top surfaces of the bit lines, or more specifically, the top surfaces of the mask layer 620 are exposed. The ILD layer 660 covers, and is in direct contact with, the sidewall spacers 630, the insulating layer 166, the annular spacers 520, and the metal plug 614.

Figure 23:
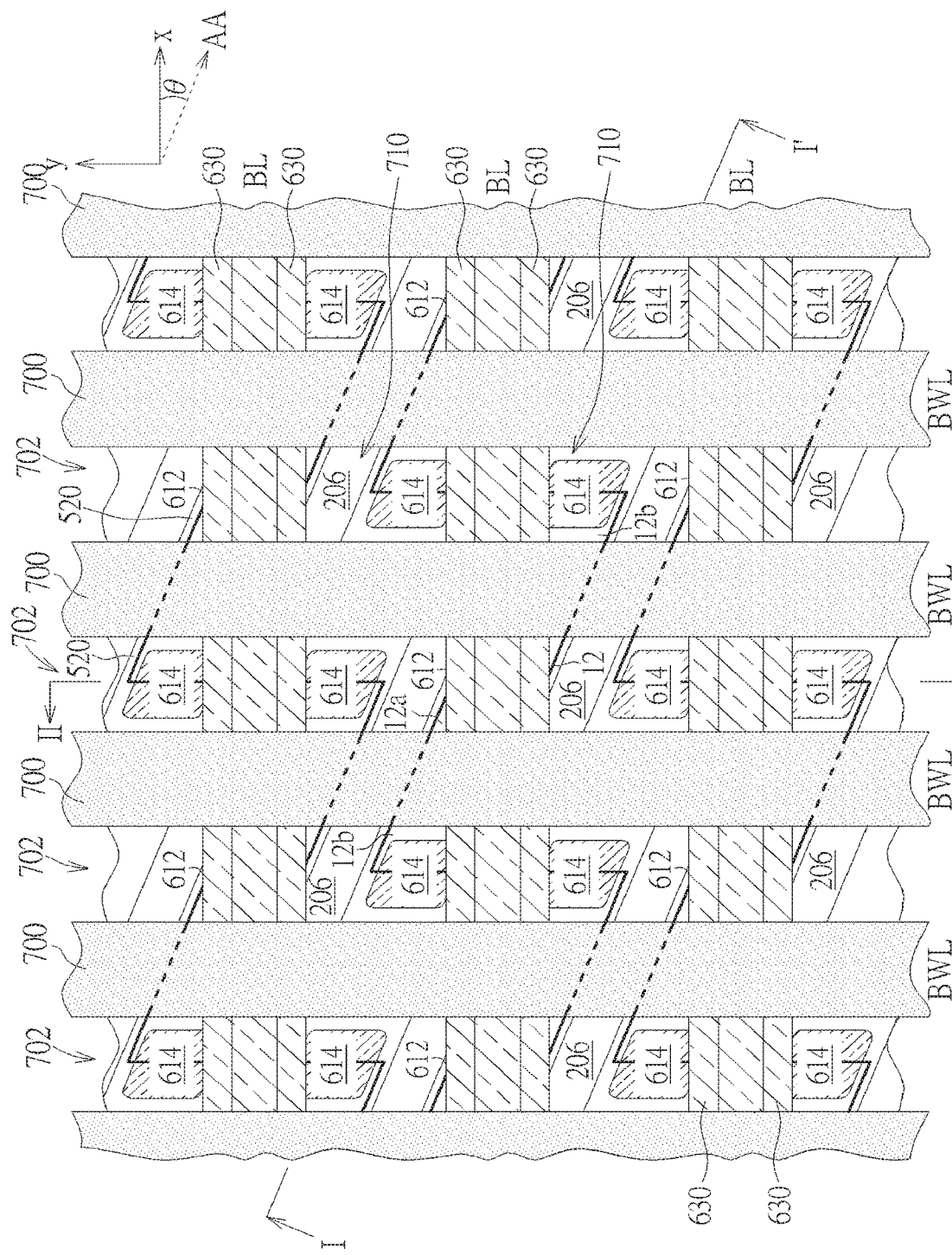
Figure 24:
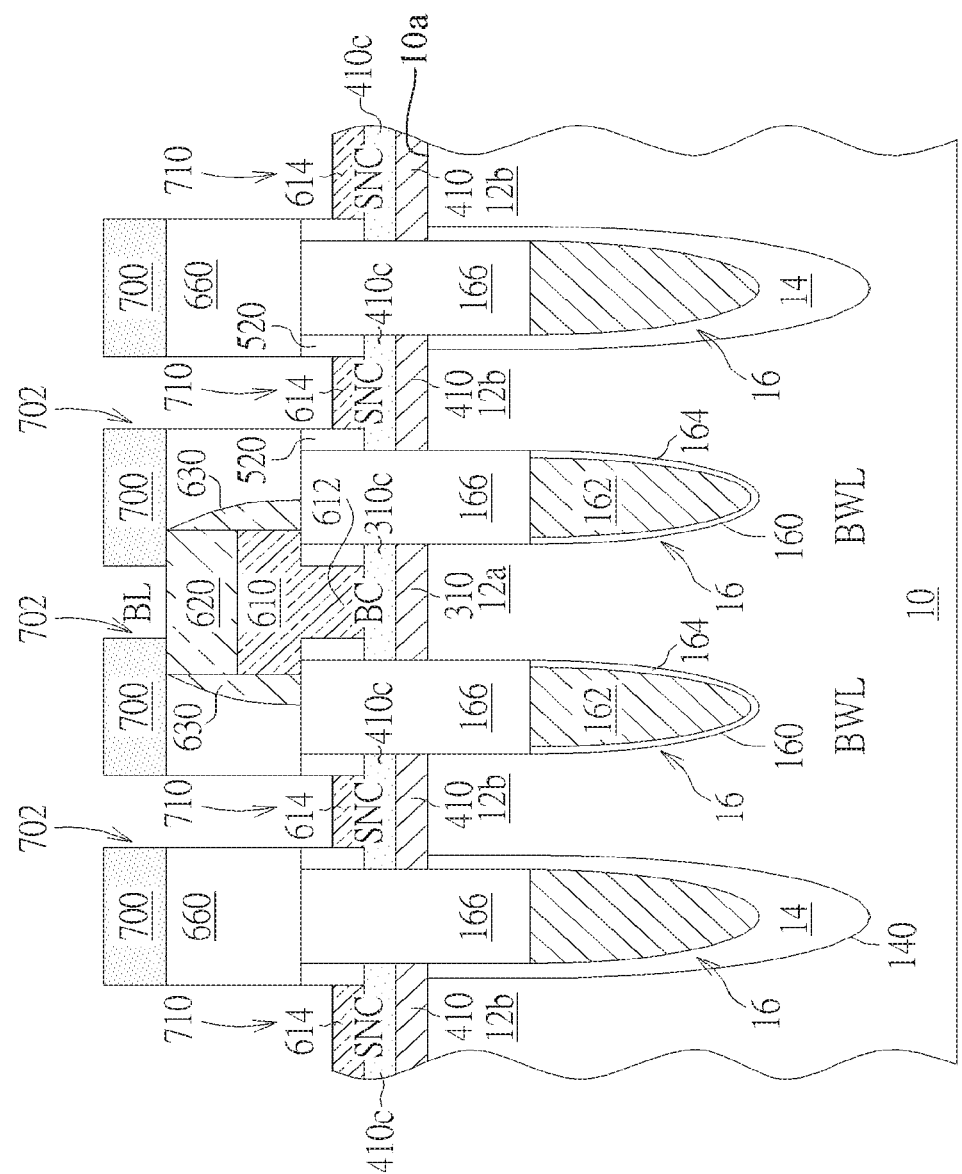
Figure 25:
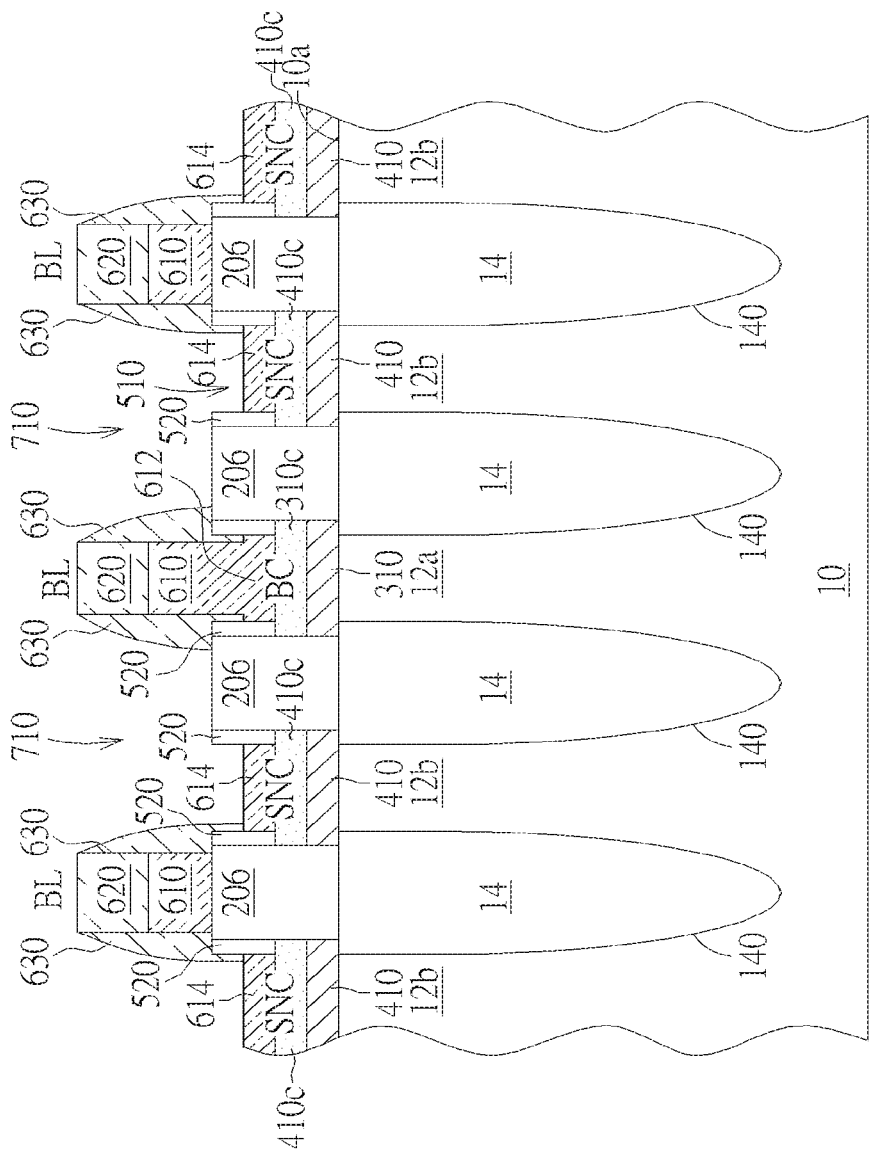

Please refer to FIG. 23 to FIG. 25. FIG. 23 is a top view of the schematic layout of the memory array of the memory device after forming line-shaped photoresist patterns 700 according to one embodiment of the invention. FIG. 24 and FIG. 25 are schematic, cross-sectional views taken along line I-I' and II-II', respectively, in FIG. 23. As shown in FIG. 23 to FIG. 25, after forming ILD layer 660, line-shaped photoresist patterns 700 extending along the reference y-axis are formed on the ILD layer 660 and on the mask layer 620. According to the embodiment, the line-shaped photoresist patterns 700 are disposed directly above the buried word lines (BWLs) and are aligned with the buried word lines, respectively. Line-shaped openings 702 are formed between the line-shaped photoresist patterns 700 to partially expose the intermittent ILD layer 660 and the mask layers 620 along the reference y-axis.

Subsequently, using the line-shaped photoresist patterns 700, the mask layer 620, and the sidewall spacers 630 as an etching hard mask, an anisotropic dry etching process is performed to selectively etch the ILD layer 660 not covered by the line-shaped photoresist patterns 700, thereby forming storage node trenches 710 in the ILD layer 660 in a self-aligned manner. The boundary of each of the storage node trenches 710 is basically defined by the edges of the line-shaped photoresist patterns 700 and the sidewall spacers 630. At the bottom of each of the storage node trenches 710, a portion of the metal plug 614, a portion of the annular spacer 520, and a portion of the insulating layer 206 are exposed. After forming the storage node trenches 710, the line-shaped photoresist patterns 700 are removed using methods known in the art.

In some embodiments, the top surface of the exposed annular spacer 520 and the top surface of the exposed portion of the insulating layer 206 may be lower than the top surface of the exposed portion of the metal plug 614 at the bottom of each storage node trench 710 to further partially expose a vertical sidewall of the metal plug 614.

Figure 26:
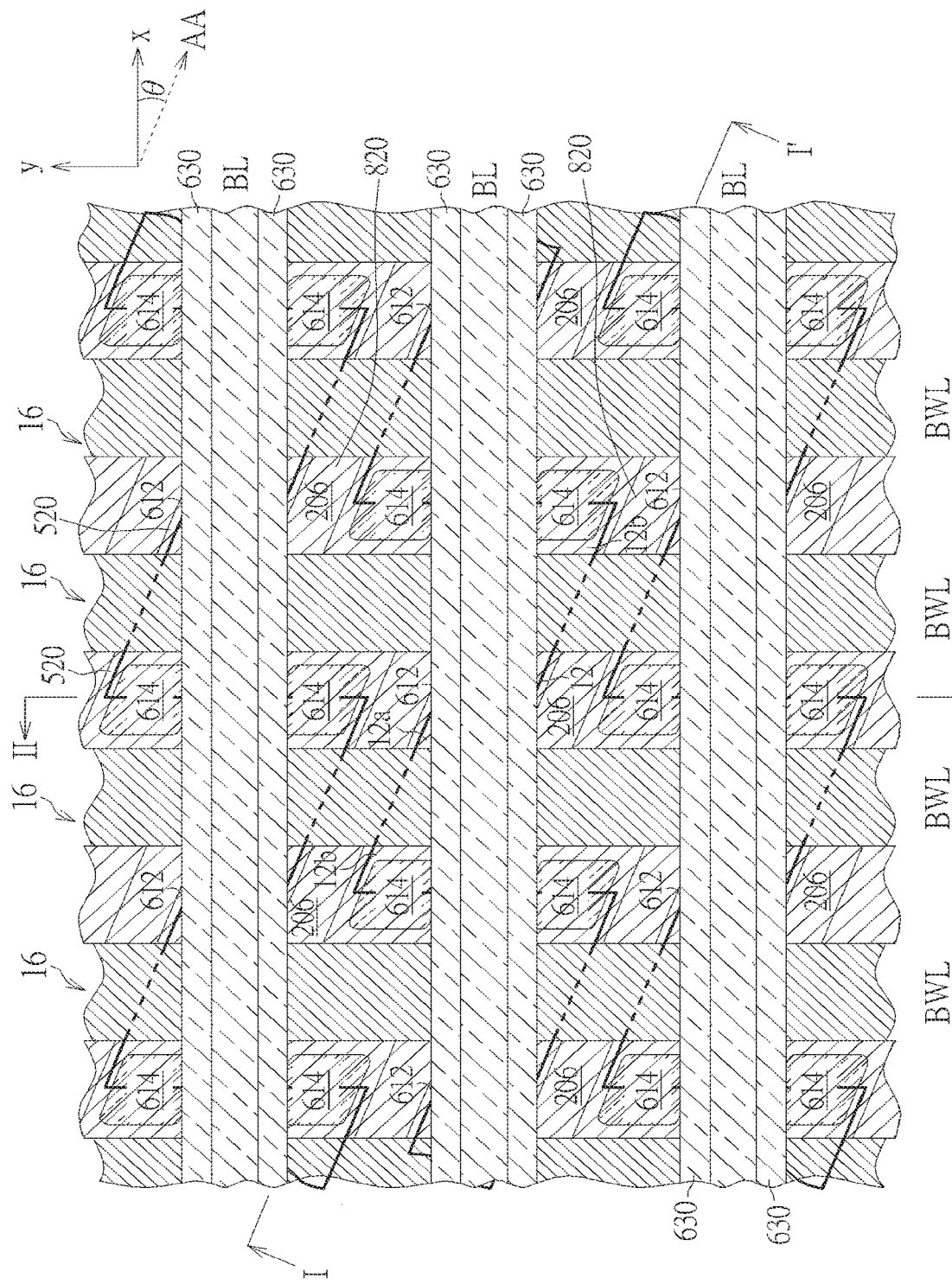
Figure 27:
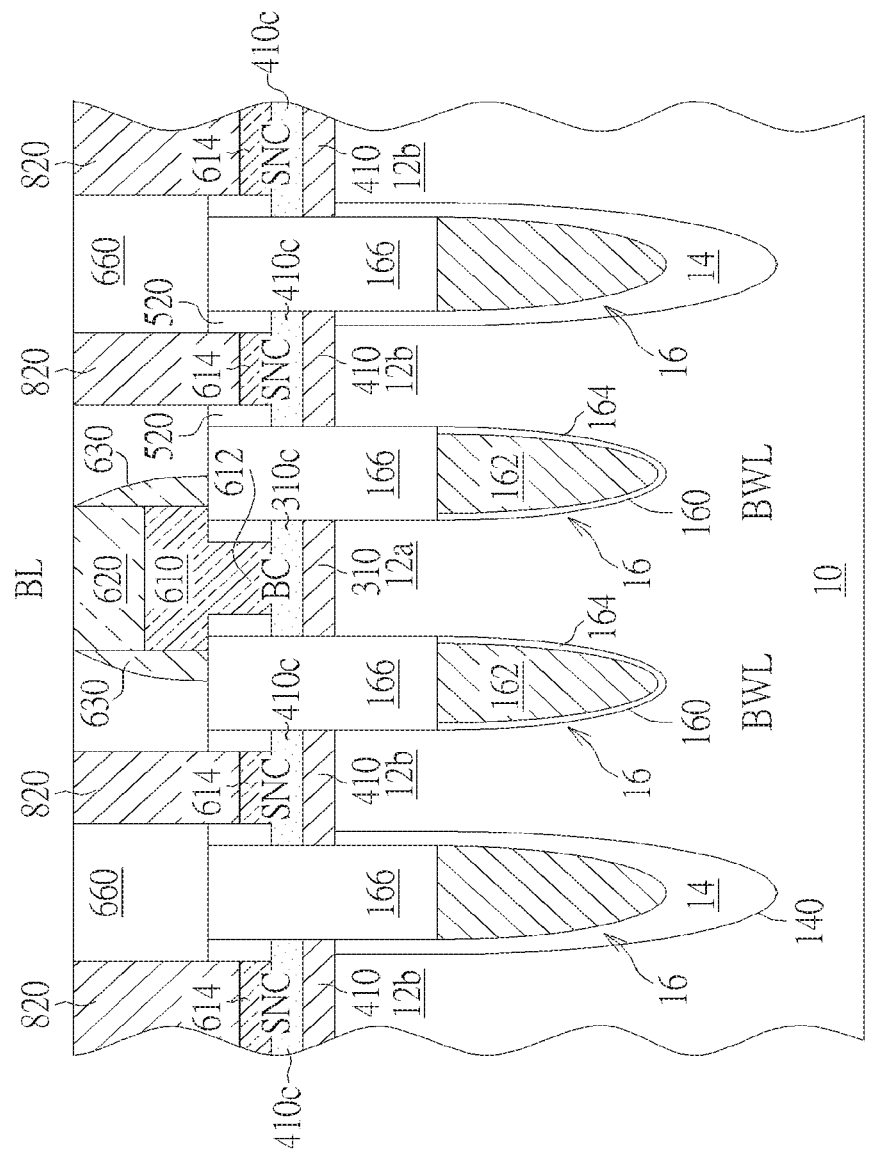
Figure 28:
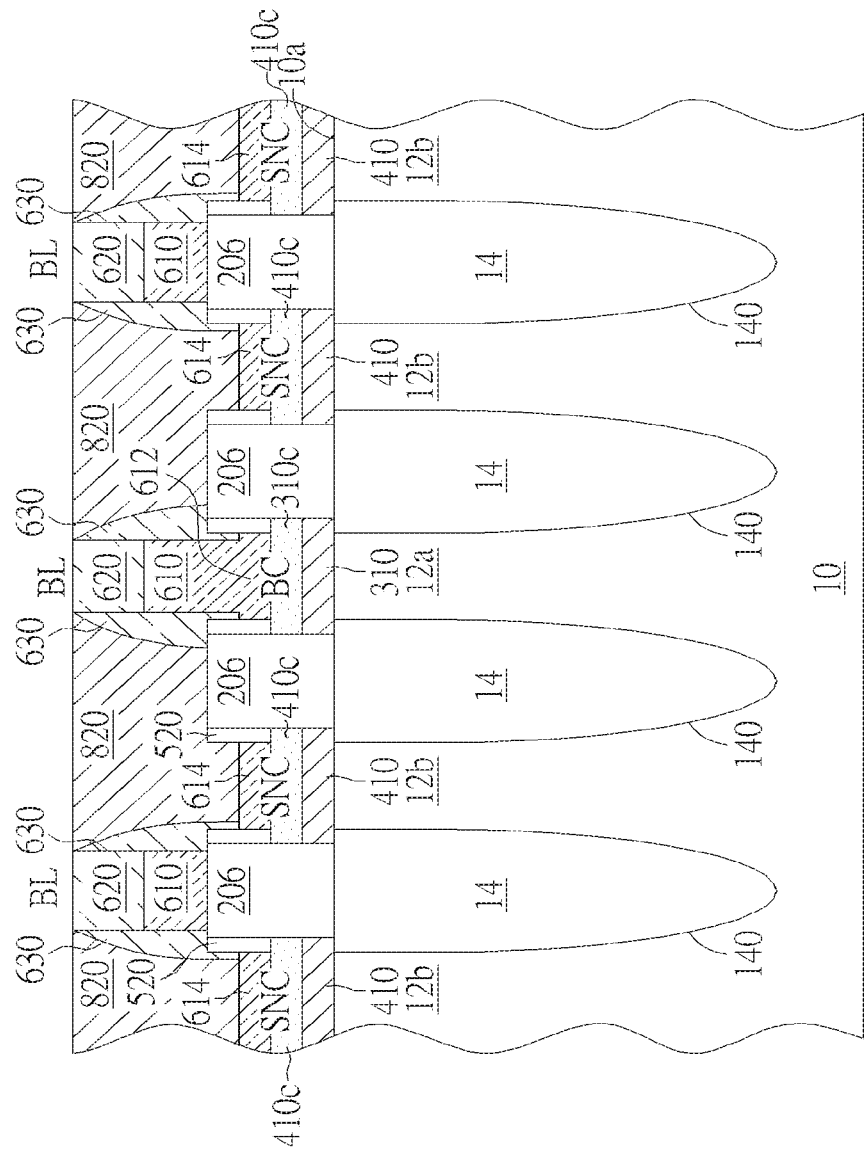

Please refer to FIG. 26 to FIG. 28. FIG. 26 is a top view of the schematic layout of the memory array of the memory device after forming storage nodes 820 in the storage node trenches 710 according to one embodiment of the invention. FIG. 27 and FIG. 28 are schematic, cross-sectional views taken along line I-I' and II-II', respectively, in FIG. 26. As shown in FIG. 26 to FIG. 28, after forming the storage node trenches 710 in the ILD layer 660, storage nodes 820 are formed within the storage node trenches 710, respectively. To form the storage nodes 820, for example, a polysilicon layer such as a doped polysilicon layer is deposited onto the semiconductor substrate 10 in a blanket manner. The polysilicon layer fills up the storage node trenches 710 and covers the bit lines. A polishing process such as a CMP process is then performed to remove excess polysilicon layer outside the storage node trenches 710 and reveals the top surface of the mask layer 620. At this point, the top surface of the storage node 820 is flush with the top surface of the mask layer 620. The storage node 820 is electrically connected to the metal plug 614.

Figure 29:
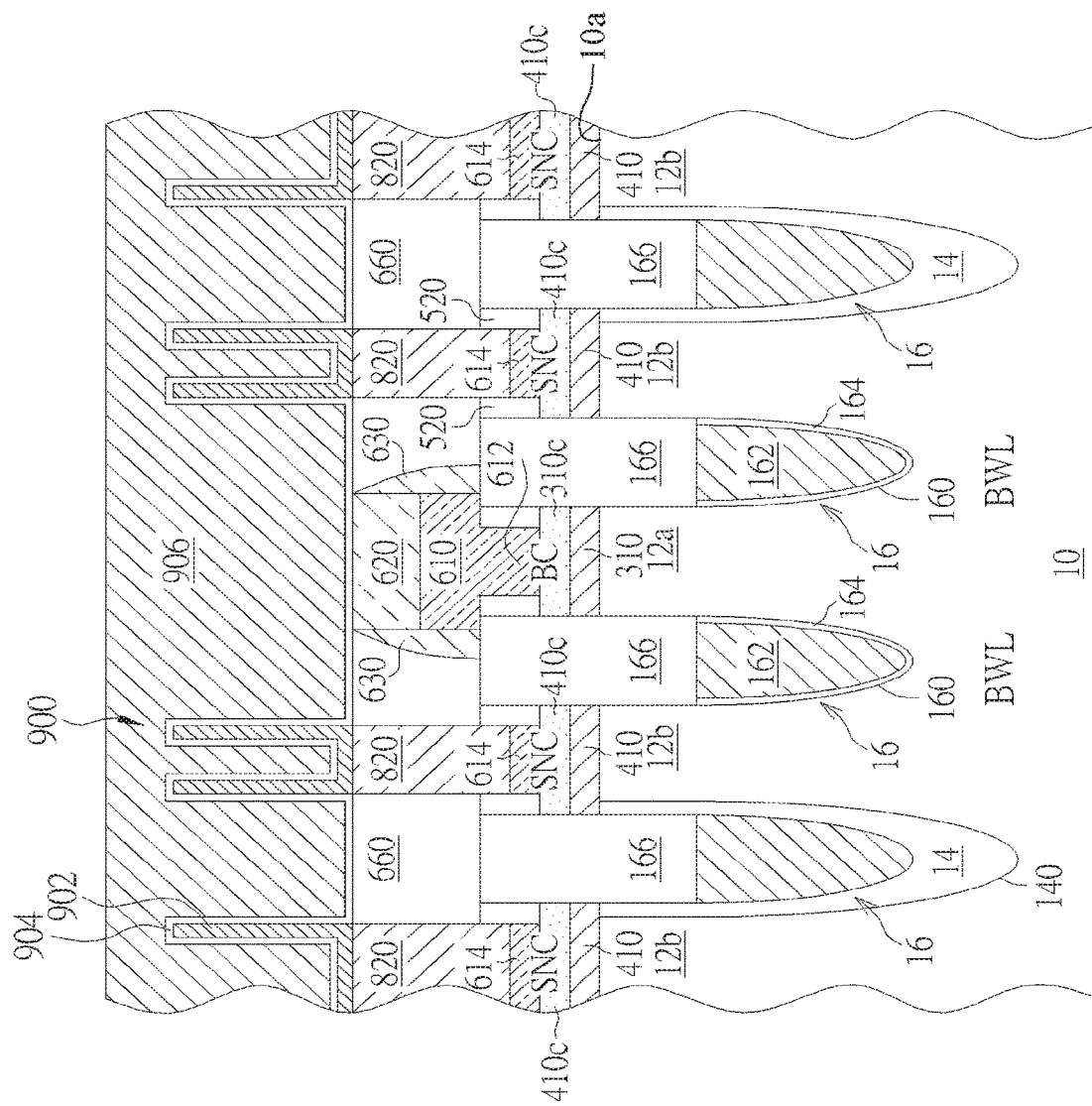
Figure 30:
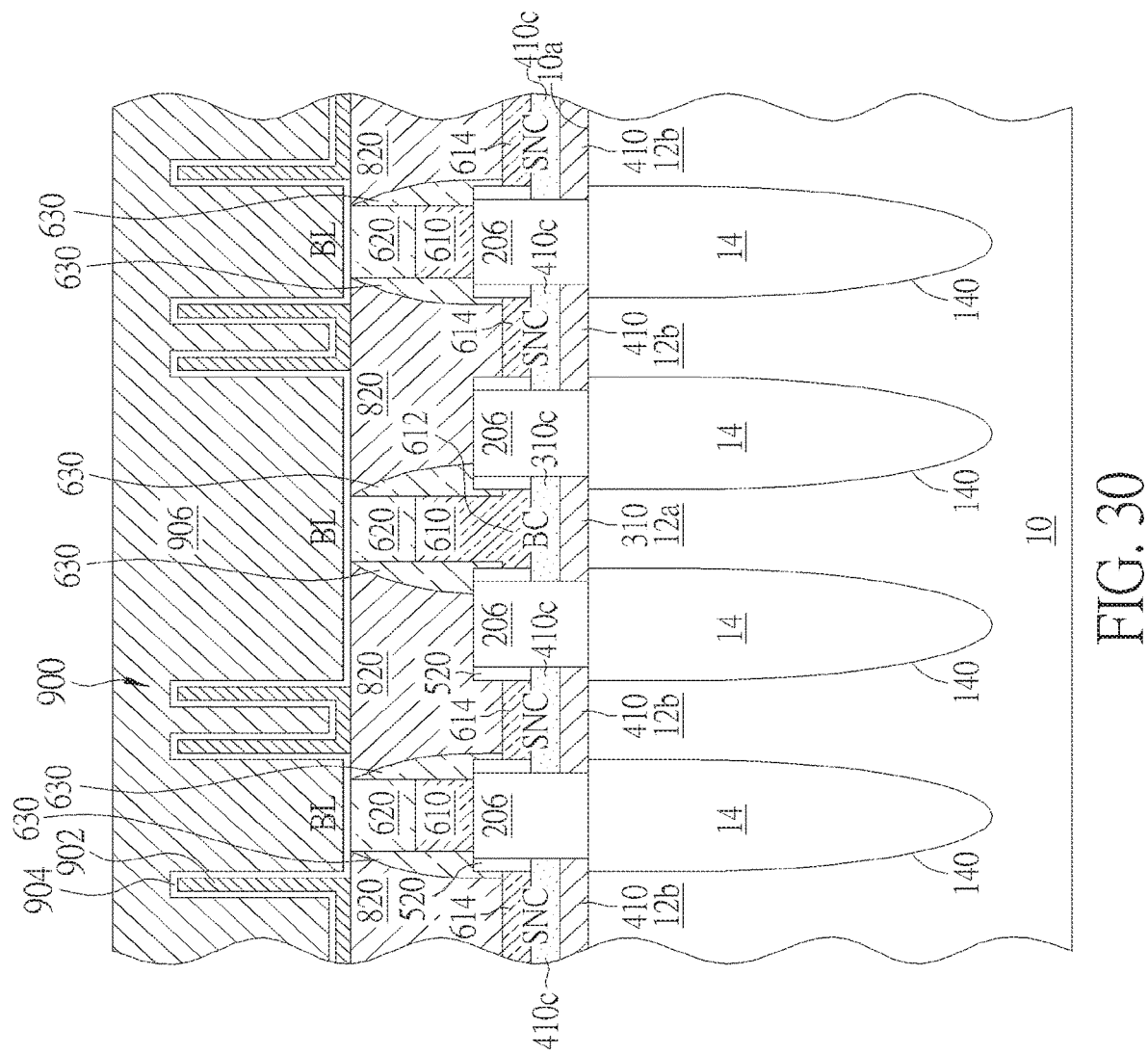

FIG. 29 and FIG. 30 are schematic, cross-sectional views taken along line I-I' and line II-II', respectively, in FIG. 26, showing the memory device after forming capacitors on respective storage nodes. As shown in FIG. 29 and FIG. 30, after forming the storage nodes 820, a capacitor 900 is fabricated on each storage node 820. It is understood that the structure of the capacitor 900 in this figure is for illustration purposes only. For example, the capacitor 900 may comprise a bottom electrode 902, a capacitor dielectric layer 904, and a top electrode 906. It is understood that other types of capacitor structures may be employed.

Figure 29A:
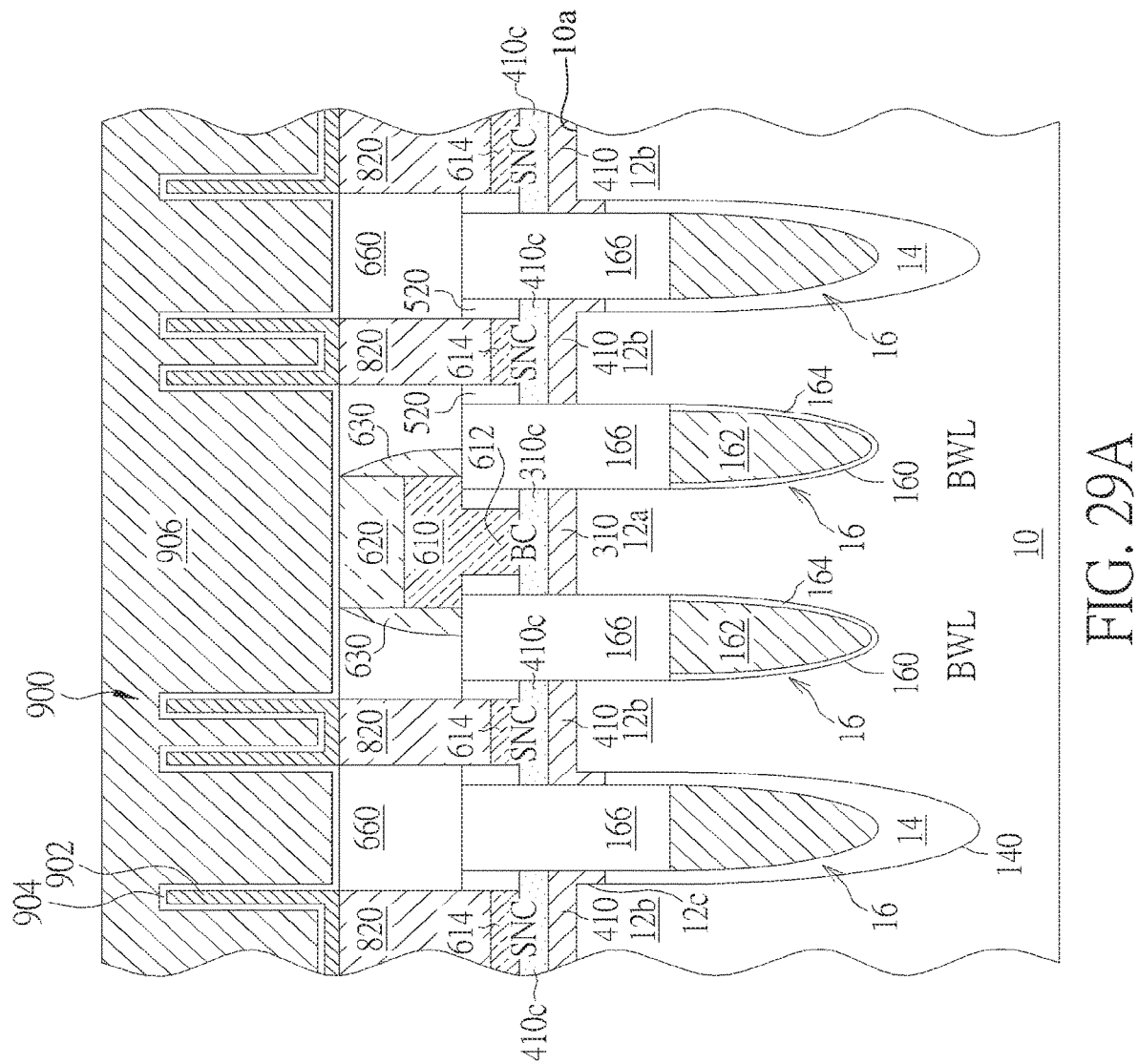
Figure 30A:
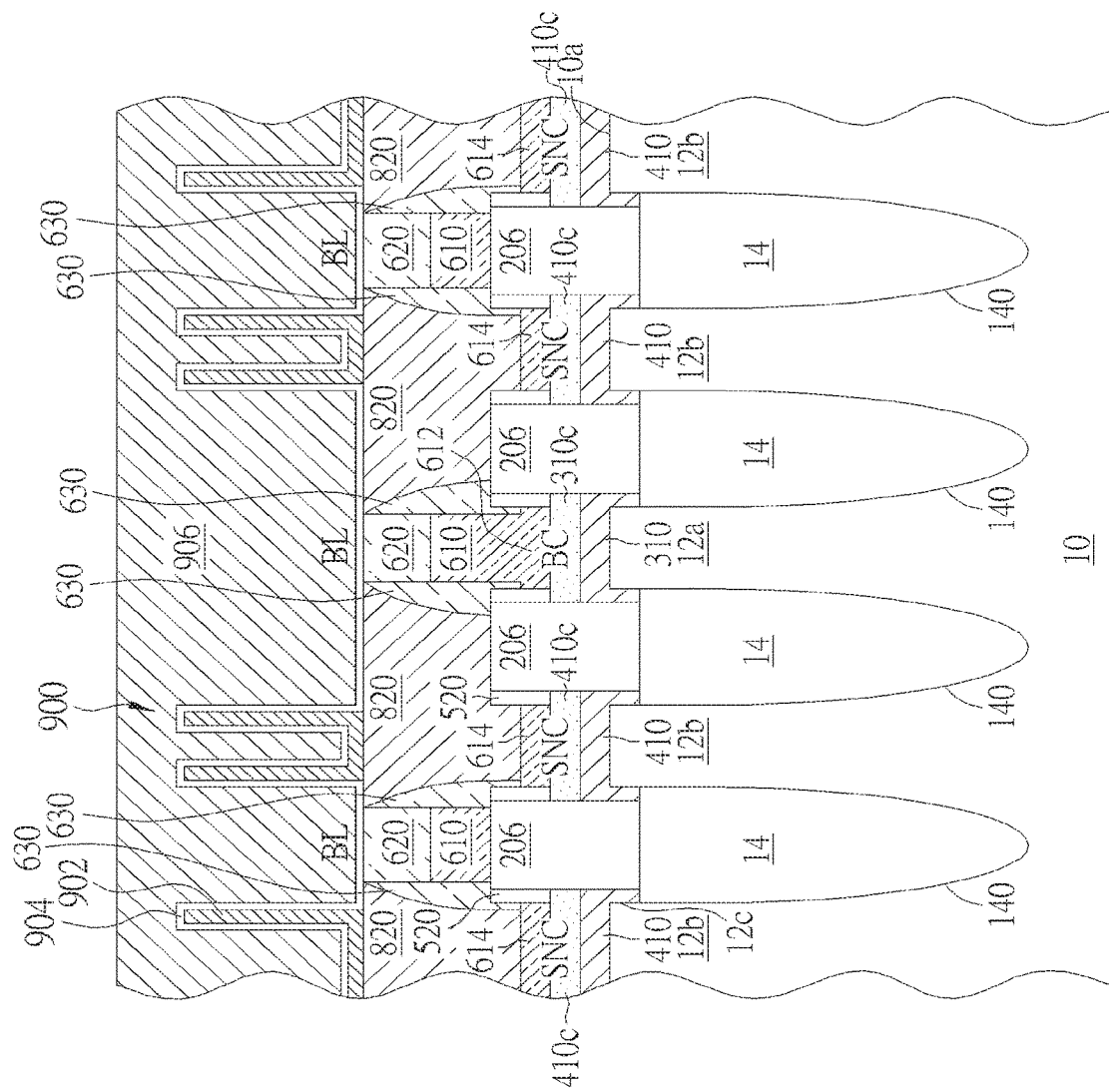

FIG. 29A and FIG. 30A are schematic diagrams illustrating a process for fabricating three-dimensional (3D) contact plugs in accordance with another embodiment of this invention. FIG. 29A and FIG. 30A are schematic, cross-sectional views taken along line I-I' and line II-II', respectively, in FIG. 26, showing the memory device after forming capacitors on respective storage nodes according to another embodiment.

As previously described in FIG. 2A and FIG. 3A, after recessing the STI structure 14, the plug material layer 110 is deposited. The exposed sidewall 12c of each active area 12 is in direct contact with the plug material layer 110. FIG. 29A and FIG. 30A show the novel 3D contact structure after forming the capacitor 900 on each storage node 820.

According to the embodiment, the digit line contact (BC) and storage node contact (SNC) are both 3D contacts. Each of the digit line contact areas 12a and each of the cell contact areas 12b may have four sidewalls 12c. The digit line contact plugs 310 and cell contact plugs 410 are in direct contact with the sidewalls 12c of the digit line contact areas 12a and the cell contact areas 12b, respectively. The 3D contact structure increases the contact area between the digit line contact plugs 310 and the digit line contact area 12a and the contact area between the cell contact plugs 410 and the cell contact areas 12b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
active areas and a trench isolation region between the active areas, each of the active areas comprising a longer side extending in a first direction;
buried word lines extending in a second direction, two of the buried word lines intersecting with each of the active areas and separating each of the active areas into a digit line contact area and two cell contact areas, wherein the second direction is not perpendicular to the first direction;
a digit line contact adjacent to the digit line contact area;
a storage node contact adjacent to each of the two cell contact areas, wherein the digit line contact and the storage node contact are substantially coplanar; and
at least one digit line extending in a third direction, wherein the at least one digit line is adjacent to the digit line contact.

2. The semiconductor device of claim 1, wherein each of the digit line contact and the storage node contact comprises polysilicon.

3. The semiconductor device of claim 1, wherein each of the digit line contact and the storage node contact comprises polysilicon and a metal.

4. The semiconductor device of claim 1, wherein the digit line contact comprises a digit line contact plug and a metal plug.

5. The semiconductor device of claim 4, wherein the digit line contact plug substantially completely covers the digit line contact area.

6. The semiconductor device of claim 1, wherein the storage node contact comprises a cell contact plug and a metal plug.

7. The semiconductor device of claim 6, wherein the cell contact plug substantially completely covers the cell contact area.

8. The semiconductor device of claim 1, further comprising a capacitor electrically connected with the cell contact area.

9. A semiconductor device, comprising:
active areas and a trench isolation region between the active areas, each of the active areas comprising a longer side extending in a first direction;
buried word lines extending in a second direction, two of the buried word lines intersecting with each of the active areas and separating each of the active areas into a digit line contact area and two cell contact areas, wherein the second direction is not perpendicular to the first direction;
a digit line contact adjacent to the digit line contact area;
a storage node contact adjacent to a top surface and a sidewall of each of the two cell contact areas; and
at least one digit line extending in a third direction perpendicular to the second direction, wherein the at least one digit line is adjacent to the digit line contact.

10. The semiconductor device of claim 9, wherein sidewalls of the storage node contact are aligned with sidewalls of cell contact plugs.

11. The semiconductor device of claim 10, wherein the cell contact plugs directly contact sidewalls of the active areas.

12. The semiconductor device of claim 9, wherein sidewalls of the digit line contact are aligned with sidewalls of digit line contact plugs.

13. The semiconductor device of claim 9, wherein the cell contact areas are located at distal ends of the active areas.

14. The semiconductor device of claim 9, wherein the digit line contact area is located between two of the buried word lines.

15. The semiconductor device of claim 9, wherein a top surface of the trench isolation region is recessed relative to a top surface of the active areas.

16. A semiconductor device, comprising:
active areas and a trench isolation region between the active areas, each of the active areas comprising a longer side extending in a first direction;
buried word lines extending in a second direction, two of the buried word lines intersecting with each of the active areas and separating each of the active areas into a digit line contact area and two cell contact areas, wherein the second direction is not perpendicular to the first direction;
a digit line contact on the digit line contact area;
a storage node contact adjacent to a top surface of each of the two cell contact areas and the trench isolation region; and
at least one digit line extending in a third direction, wherein the at least one digit line is adjacent to the digit line contact and the third direction is perpendicular to the second direction.

17. The semiconductor device of claim 16, wherein a top surface of the trench isolation region is substantially coplanar with a top surface of the active areas.

18. The semiconductor device of claim 16, wherein a top surface of the trench isolation region is recessed relative to a top surface of the active areas.

19. The semiconductor device of claim 16, further comprising an insulating material over a conductive material within the active areas, a top surface of the insulating material coplanar with a top surface of an annular spacer surrounding the insulating material.

20. The semiconductor device of claim 16, further comprising an insulating material over the trench isolation region, a top surface of the insulating material coplanar with a top surface of an annular spacer surrounding the insulating material.

* * * * *